US012610654B2

(12) United States Patent
Lius et al.

(10) Patent No.:     US 12,610,654 B2
(45) Date of Patent:         Apr. 21, 2026

(54) ELECTRONIC DEVICE WITH ENHANCED SENSING ACCURACY, SENSING CLEARNESS AND LIGHT INTENSITY OF RECEIVED LIGHT OF SENSING ELEMENT

(71) Applicant: InnoLux Corporation, Viao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 686 days.

(21) Appl. No.: 17/900,885

(22) Filed: Sep. 1, 2022

(65) Prior Publication Data

US 2023/0094848 A1     Mar. 30, 2023

(30) Foreign Application Priority Data

Sep. 30, 2021     (CN) ........................... 202111161016.7

(51) Int. Cl.
| | |
|---|---|
| *H10F 77/30* | (2025.01) |
| *H01L 25/075* | (2006.01) |
| *H01L 25/16* | (2023.01) |
| *H10H 20/855* | (2025.01) |

(52) U.S. Cl.
CPC ....... *H10F 77/334* (2025.01); *H01L 25/0753* (2013.01); *H01L 25/167* (2013.01); *H10H 20/855* (2025.01)

(58) Field of Classification Search
CPC ...... H01L 25/167; H10K 59/60; H10F 77/334

USPC ........................................................ 257/13, 79
See application file for complete search history.

(56) References Cited

U.S. PATENT DOCUMENTS

| | | | |
|---|---|---|---|
| 11,653,534 B2 | 5/2023 | Koh | |
| 2020/0176519 A1 | 6/2020 | Seo | |
| 2021/0098556 A1* | 4/2021 | Jang | H10K 59/123 |
| 2021/0175303 A1* | 6/2021 | Bang | H10K 59/65 |
| 2021/0202900 A1* | 7/2021 | Lee | H10K 50/844 |

FOREIGN PATENT DOCUMENTS

CN              113363293 A          9/2021

* cited by examiner

*Primary Examiner* — Eliseo Ramos Feliciano
*Assistant Examiner* — Mikka Liu
(74) *Attorney, Agent, or Firm* — Winston Hsu

(57)                    ABSTRACT

A display panel having a display region which has a sensing area includes a substrate, a semiconductor layer, a light shielding layer and a first insulating layer. The semiconductor layer is disposed on the substrate. The light shielding layer is disposed between the semiconductor layer and the substrate and has a first through hole in the sensing area. The first insulating layer is disposed on the semiconductor layer and has a second through hole in the sensing area. The first through hole and the second through hole are overlapped with each other. In a cross section view of the display panel, the first through hole has a first edge, the second through hole has a second edge which is closer to the first edge and a distance between the first edge and the second edge is greater than zero.

17 Claims, 16 Drawing Sheets

A-A'

ELECTRONIC DEVICE WITH ENHANCED SENSING ACCURACY, SENSING CLEARNESS AND LIGHT INTENSITY OF RECEIVED LIGHT OF SENSING ELEMENT

BACKGROUND OF THE DISCLOSURE

1. Field of the Disclosure

The present disclosure relates to an electronic device, and more particularly to an electronic device having a through hole in the sensing area.

2. Description of the Prior Art

As the evolution and development of electronic devices, the electronic devices have become an indispensable item. The electronic devices such as display devices (or display panels) provide more convenient information transmission or image display. In order to make the display device have more functions, additional required components (e.g., components for sensing touch, light, sound and other external information) will be disposed in the display device, such that the display device will take corresponding actions based on the sensing results. Therefore, the industry is devoted to arranging these required components while maintaining the display effect of the display device, the yield rate of the display device and/or the good function of the these required components.

SUMMARY OF THE DISCLOSURE

According to an embodiment, the present disclosure provides a display panel having a display region which has a sensing area, wherein the display panel includes a substrate, a semiconductor layer, a light shielding layer and a first insulating layer. The semiconductor layer is disposed on the substrate. The light shielding layer is disposed between the semiconductor layer and the substrate and has a first through hole in the sensing area. The first insulating layer is disposed on the semiconductor layer and has a second through hole in the sensing area. The first through hole and the second through hole are overlapped with each other. In a cross section view of the display panel, the first through hole has a first edge, the second through hole has a second edge which is closer to the first edge and a distance between the first edge and the second edge is greater than zero.

According to another embodiment, the present disclosure provides a display device including a sensing element and a display panel. The display panel has a display region which has a sensing area overlapped with the sensor element, and the display panel includes a substrate, a semiconductor layer, a light shielding layer and an insulating layer. The semiconductor layer is disposed on the substrate. The light shielding layer is disposed between the semiconductor layer and the substrate and has a first through hole in the sensing area. The insulating layer is disposed on the semiconductor layer and has a second through hole in the sensing area. The first through hole and the second through hole are overlapped with each other. In a cross section view of the display panel, the first through hole has a first edge, the second through hole has a second edge which is closer to the first edge and a distance between the first edge and the second edge is greater than zero.

DETAILED DESCRIPTION

Figure 1:
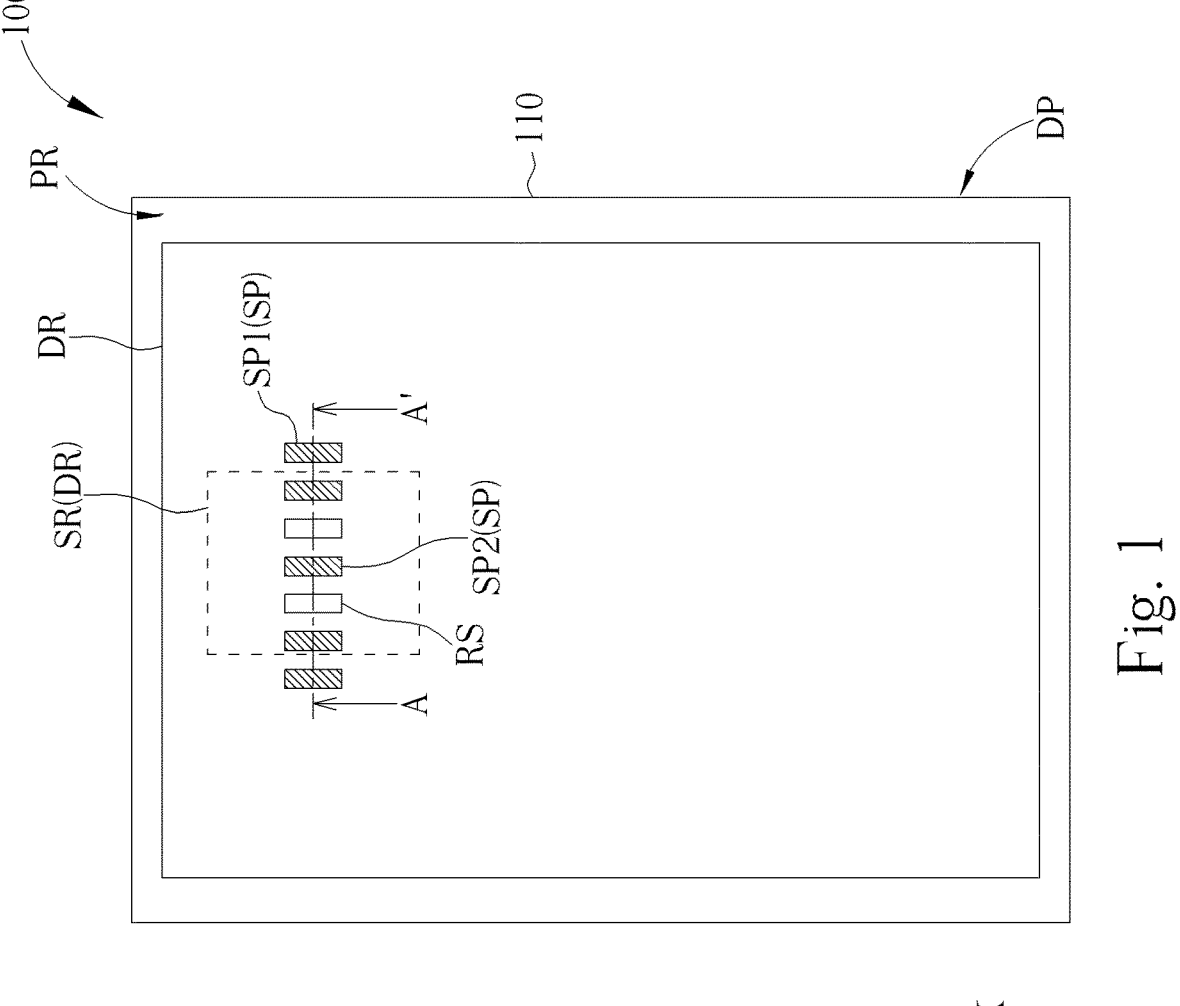
FIG. 1 is a schematic diagram showing a top view of a display device according to a first embodiment of the present disclosure.

The present disclosure may be understood by reference to the following detailed description, taken in conjunction with the drawings as described below. It is noted that, for purposes of illustrative clarity and being easily understood by the readers, various drawings of this disclosure show a portion of a display device in this disclosure, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ". Thus, when the terms "include", "comprise" and/or "have" are used in the description of the present disclosure, the corresponding features, areas, steps, operations and/or components would be pointed to existence, but not limited to the existence of one or a plurality of the corresponding features, areas, steps, operations and/or components.

The directional terms used throughout the description and following claims, such as: "on", "up", "above", "down", "below", "front", "rear", "back", "left", "right", etc., are only directions referring to the drawings. Therefore, the directional terms are used for explaining and not used for limiting the present disclosure. Regarding the drawings, the drawings show the general characteristics of methods, structures, and/or materials used in specific embodiments. However, the drawings should not be construed as defining or limiting the scope or properties encompassed by these embodiments. For example, for clarity, the relative size, thickness, and position of each layer, each area, and/or each structure may be reduced or enlarged.

When the corresponding component such as layer or area is referred to "on another component", it may be directly on this another component, or other component (s) may exist between them. On the other hand, when the component is referred to "directly on another component (or the variant thereof)", any component does not exist between them. Furthermore, when the corresponding component is referred to "on another component", the corresponding component and the another component have a disposition relationship along a top-view/vertical direction, the corresponding component may be below or above the another component, and the disposition relationship along the top-view/vertical direction are determined by an orientation of the device.

It will be understood that when a component or layer is referred to as being "connected to" another component or layer, it can be directly connected to this another component or layer, or intervening components or layers may be presented. In contrast, when a component is referred to as being "directly connected to" another component or layer, there are no intervening components or layers presented. In addition, when the component is referred to "be coupled to/with another component (or the variant thereof)", it may be directly connected to this another component, or may be indirectly connected (such as electrically connected) to this another component through other component(s).

The terms "about", "substantially", "equal", or "same" generally mean within ±20% of a given value or range, or mean within +10%, +5%, +3%, +2%, +1%, or ±0.5% of a given value or range.

Although terms such as first, second, third, etc., may be used to describe diverse constituent elements, such constituent elements are not limited by the terms. These terms are used only to discriminate a constituent element from other constituent elements in the specification, and these terms have no relation to the manufacturing order of these constituent components. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

In the description and following claims, the term "horizontal direction" generally means a direction parallel to a horizontal surface, the term "horizontal surface" generally means a surface parallel to a direction X and direction Y in the drawings, and the term "vertical direction" generally means a direction parallel to a direction Z and perpendicular to the horizontal direction in the drawings. In the description and following claims, the term "top view" generally means a viewing result along the vertical direction.

In the description and following claims, it should be noted that the term "overlap" means that two elements overlap along the direction Z, and the term "overlap" can be "partially overlap" or "completely overlap". In the description and following claims, the term "parallel" means that an angle between two elements is less than or equal to the specific degree(s), such as 5 degrees, 3 degrees or 1 degree.

According to an embodiment of the present disclosure, a width of the component, a thickness of the component, a height of the component, an area of the component or a distance between two components may be measured by an optical microscopy (OM), a scanning electron microscope (SEM), an Alpha step ($\alpha$-step), ellipsometer or other suitable method, but not limited thereto. In detail, according to some embodiments, a cross-sectional image containing the component(s) desiring to be measured may be obtained by using the SEM, such that the width of the component, the thickness of the component, the height of the component, the area of the component or the distance between two components may be measured, and a volume of the component may be obtained by a suitable method (e.g., integral). In addition, any two values or directions used for comparison may have certain errors. In an embodiment of the present disclosure, the cross-section may be, for example, a cross-sectional view through a center of a through hole or a cross-sectional view through any position of a through hole, but not limited thereto.

In the present disclosure, the electronic device may include a display device, a backlight device, an antenna device, a sensing device or a tiled device, but not limited thereto. The electronic device may be a foldable electronic device or a flexible electronic device. The display device may be a non-self-luminous type display device or a self-luminous type display device, the antenna device may be a liquid-crystal-type antenna device or a non-liquid-crystal-type antenna device, and the sensing device may be a device for sensing capacitance, light, thermal or ultrasonic, but not limited thereto. For example, the electronic device may include a diode, a light emitting diode (LED), liquid crystal molecules, fluorescence material, phosphor material, quantum dot (QD) material, other suitable display medium or a combination thereof, but not limited thereto. For instance, the light emitting diode may include an organic light-emitting diode (OLED), an inorganic light-emitting diode (LED), a mini LED, a micro-LED, a quantum-dot LED (QLED, QDLED), other suitable material or a combination thereof, but not limited thereto. Furthermore, the display device may be a color display device or a monochrome display device. The electronic device may have a peripheral system (such as a driving system, a control system, a light system, etc.) for supporting the display device, the backlight device, the antenna device, the sensing device or the tiled device. A shape of the electronic device may be a rectangle, a circle, a polygon, a shape having a curved edge or other suitable shapes, but not limited thereto. Hereinafter, the display device will be used as the electronic device or the tiled device to illustrate the present disclosure, but the present disclosure is not limited thereto.

Figure 2:
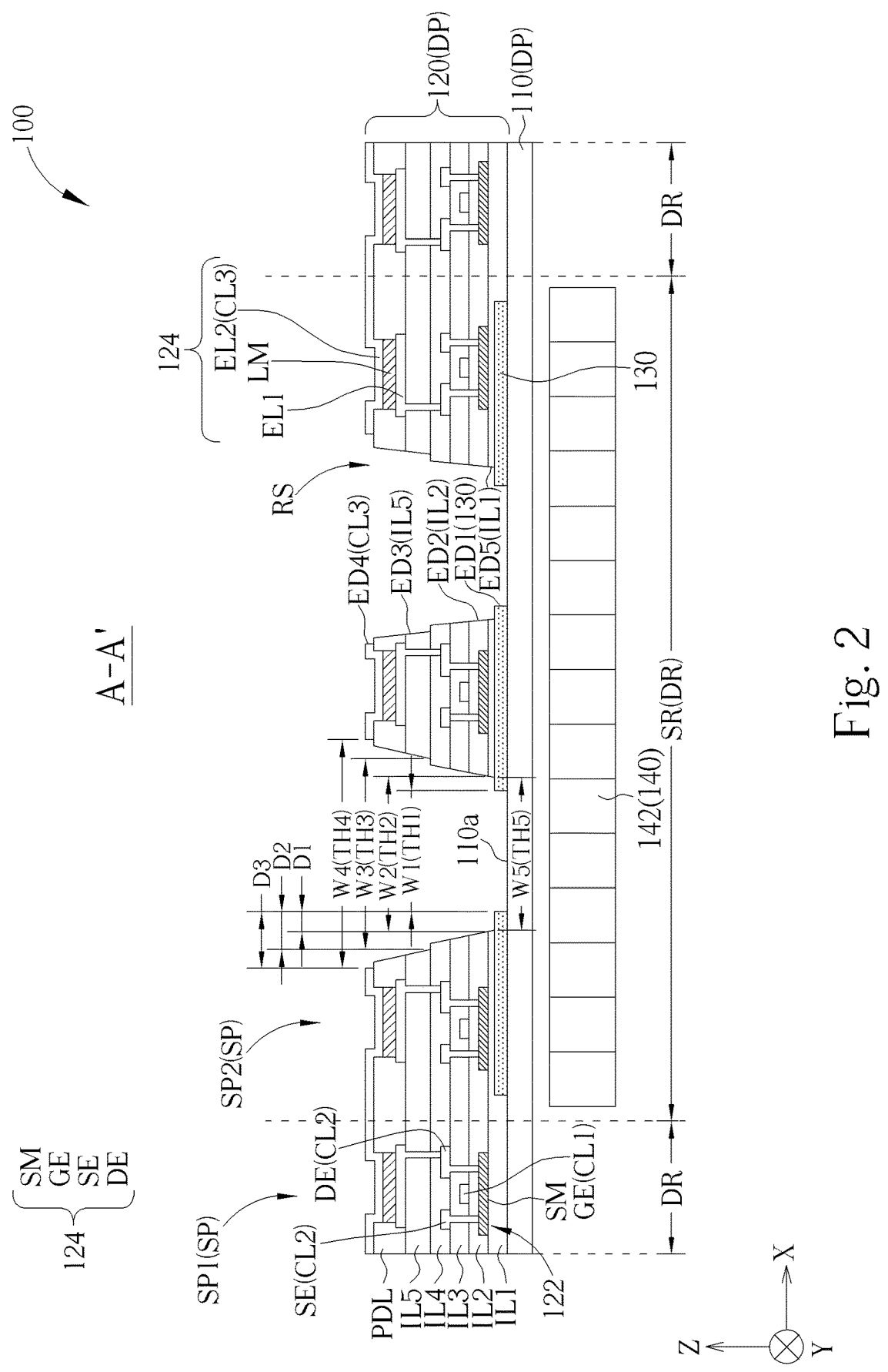
FIG. 2 is a schematic diagram showing a cross-sectional view of a structure taken along a cross-sectional line A-A' in FIG. 1.
Figure 3:
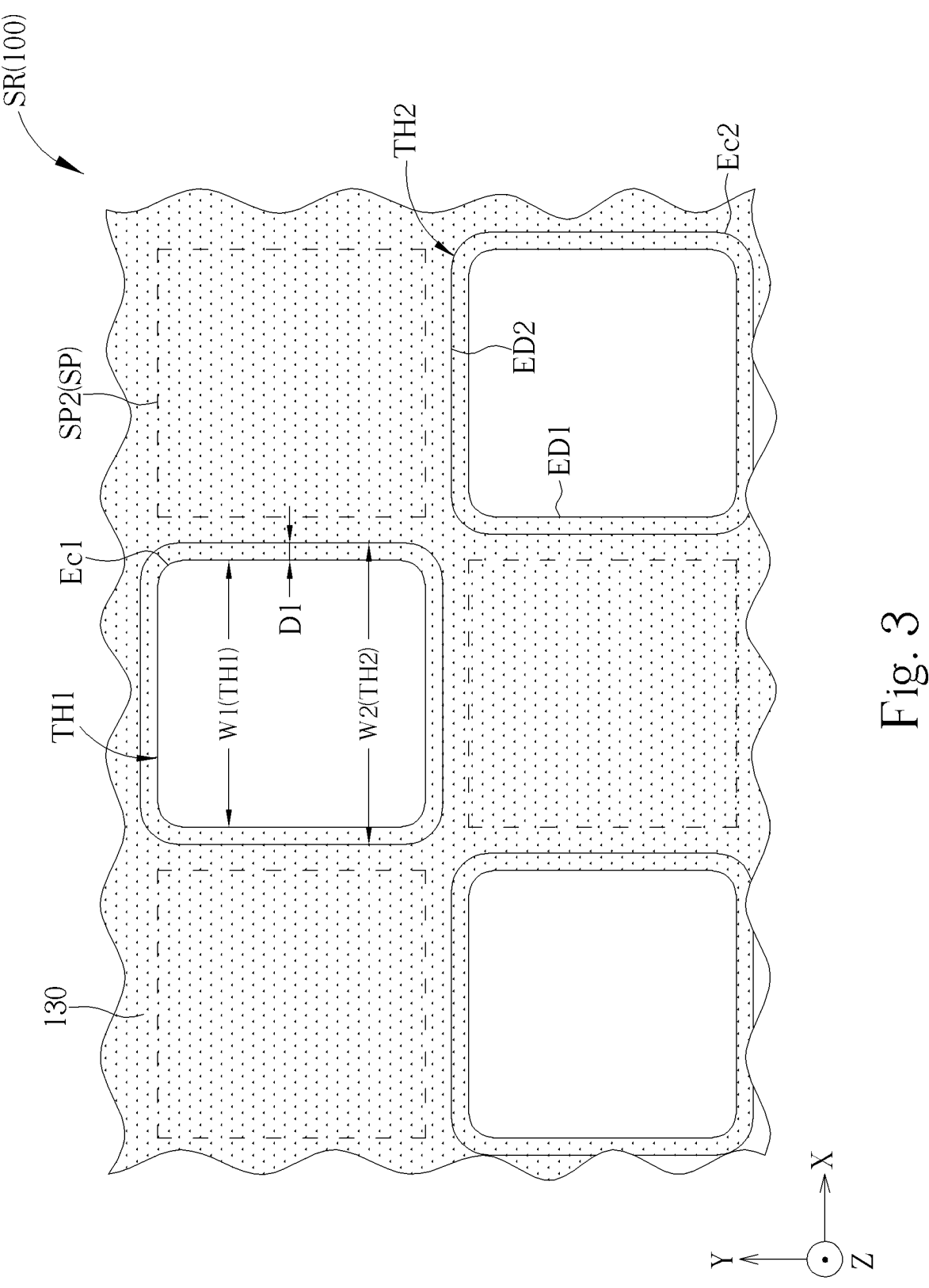
FIG. 3 is a schematic diagram showing a top view of a light shielding layer and an insulating layer according to the first embodiment of the present disclosure.

Referring to FIG. 1 to FIG. 3, FIG. 1 is a schematic diagram showing a top view of a display device according to a first embodiment of the present disclosure, FIG. 2 is a schematic diagram showing a cross-sectional view of a structure taken along a cross-sectional line A-A' in FIG. 1, and FIG. 3 is a schematic diagram showing a top view of a light shielding layer and an insulating layer according to the first embodiment of the present disclosure, wherein the insulating layer shown in FIG. 3 is the insulating layer IL2 for example (the insulating layer shown in FIG. 3 is not limited to the insulating layer IL2). As shown in FIG. 1 and FIG. 2, the display device 100 includes a display panel DP, wherein the display panel DP may have a display region DR and a peripheral region PR, the display region DR is configured to perform a display function for displaying an image, and the peripheral region PR is disposed on at least one outer side of the display region DR (e.g., the peripheral region PR surrounds the display region DR). In the present disclosure, the display region DR may include a sensing area SR configured to sense external information such as light (s) or image (s), but not limited thereto. In top view, a size of the sensing area SR (e.g., an area) may be less than or equal to a size of the display region DR. For instance, in FIG. 1, in top view, the size of the sensing area SR is less than the size of the display region DR, but not limited thereto. Furthermore, in the top view, a top-view shape of the sensing area SR and a top-view shape of the display region DR may be any suitable shape, and the top-view shape of the sensing area SR may be similar to or different from the top-view shape of the display region DR. For instance, the top-view shape of the sensing area SR and the top-view shape of the display region DR may individually be a polygon (e.g., a triangle, a rectangle or a hexagon) or a shape having a curved edge (e.g., a circle, an oval or a shape with rounded corners), but not limited thereto.

The display region DR of the display device 100 may include a plurality of pixels, and the pixel may include at least one sub-pixel SP. In some embodiments, if the display device 100 is a color display device, one pixel may include a plurality of sub-pixels SP for instance, such as a green sub-pixel, a red sub-pixel and a blue sub-pixel, but not limited thereto. The number and color of the sub-pixel(s) SP included in the pixel may be adjusted based on requirement (s). In some embodiments, if the display device 100 is a monochrome display device, one pixel may include one sub-pixel SP for instance, but not limited thereto. The number of the pixels, the arrangement of the pixels, the number of the sub-pixels SP and the arrangement of the sub-pixels SP may be adjusted based on requirement(s). For example, the sub-pixels SP may be arranged in matrix, stripe type, staggered type or any other suitable arrangement. In addition, the top-view shape of a light emitting portion of the sub-pixel SP may be a rectangle, a parallelogram, a chevron, a shape having a curved edge or other suitable shape, and the top-view shape of the light emitting portion of the sub-pixel SP may be determined by an opening of a light blocking layer, but not limited thereto. Note that the sub-pixels SP in the display region DR may include "sub-pixels SP1" disposed outside the sensing area SR and "sub-pixels SP2" disposed in the sensing area SR.

The display panel DP may include a substrate 110, and any suitable active component (such as a thin film transistor, an integrated circuit, etc.) and/or any suitable passive component may be disposed on the substrate 110. The substrate 110 may include glass, quartz, sapphire, polyimide (PI), polyethylene terephthalate (PET), other suitable materials or a combination thereof, so as to be a rigid substrate or a flexible substrate, but not limited thereto.

The display panel DP may include a circuit component layer 120 disposed on the substrate 110, wherein the circuit component layer 120 may include corresponding component (s) and/or structure(s) according to the function of the display device 100. For instance, the circuit component layer 120 may include a switching component 122 (e.g., a thin film transistor), a light emitting component 124, a passive component (e.g., a capacitor, not shown in figures), a conductive trace (e.g., a scan line and/or a data line, not shown in figures), a driving circuit (e.g., a gate driving circuit, not shown in figures), other suitable component or a combination thereof, thereby displaying the image.

The switching component 122 may include a gate GE, a source SE, a drain DE and a semiconductor layer SM. For example, the switching component 122 may be a top gate thin film transistor, a bottom gate thin film transistor, a dual gate thin film transistor or other suitable transistor, but not limited thereto.

The light emitting component 124 may provide the light having the corresponding light-intensity based on the received voltage and/or the received current, and the received voltage and/or the received current of the light emitting component 124 may be related to such as a gray level signal (provided by an integrated chip or provided from outer device), thereby displaying the image. Namely, the intensity of the light generated by the light emitting component 124 is related to the gray level of a region of the display image corresponding to this light emitting component 124. For instance, the light emitting component 124 may be a LED (e.g., OLED, inorganic LED or QLED), but not limited thereto.

The color of the light emitted from the light emitting component 124 may be designed based on requirement(s). For example, the color or the light emitted from the light emitting component 124 may be based on the sub-pixel SP where this light emitting component 124 is disposed, wherein the emitting light may be red light, green light or blue light, but not limited thereto. In some embodiments, all of the light emitting components 124 may emit the same color light, and the display panel DP may further include a light converting layer (not shown in figures) disposed on the light emitting component 124, so as to convert (or filter) the light emitted from the light emitting component 124 into another light with different color. The light converting layer may include color filter, quantum dots (QD) material, fluorescence material, phosphorescence material, other suitable material(s) or a combination thereof. For instance, the light emitting component 124 may emit white light, the light converting layer may convert the white light into another color light which the sub-pixel SP needs, such as red light, green light or blue light, but not limited thereto. For instance, the light emitting component 124 may emit blue light, the light converting layer may convert the blue light into another color light which the sub-pixel SP needs, such as red light or green light, or may not convert to maintain the blue light, but not limited thereto.

In some embodiments, the scan line may be configured to transmit switching signal(s) for turning on or turning off the of the switching component 122, the data line may be configured to transmit the gray level signal(s), and the capacitor may improve the stability of the light intensity provided by the light emitting component 124.

In the present disclosure, each sub-pixel SP may include at least one switching component 122, at least one light emitting component 124 and other suitable component (e.g., the capacitor), and these components may be electrically connected to each other for being a circuit in the sub-pixel SP based on requirement(s). For example, each sub-pixel SP may include a circuit having four switching components 122 and two capacitors (i.e., a 4T2C circuit), including a circuit having seven switching components 122 and one capacitor (i.e., a 7T1C circuit) or including other suitable circuits to drive the light emitting component 124.

In FIG. 2, the circuit component layer 120 may include at least one conductive layer, at least one insulating layer, at least one semiconductor layer, other suitable layer(s) or a combination thereof, so as to form a multi-layer structure. The material of the conductive layer may include metal, transparent conductive material (such as indium tin oxide (ITO), indium zinc oxide (IZO), etc.), other suitable conductive materials or a combination thereof, the material of the insulating layer may include such as silicon oxide ($SiO_x$), silicon nitride ($SiN_y$), silicon oxynitride ($SiO_xN_y$), organic insulating material (e.g., photosensitive resin), other suitable insulating materials or a combination thereof, and the material of the semiconductor layer may include such as polysilicon, amorphous silicon, metal-oxide semiconductor (IGZO), other suitable semiconductor materials or a combination thereof, but not limited thereto. In detail, as shown in FIG. 2, the circuit component layer 120 may include an insulating layer IL1, a semiconductor layer SM, an insulating layer IL2, a first conductive layer CL1, an insulating layer IL3, a second conductive layer CL2, an insulating layer IL4 and an insulating layer IL5 sequentially. The insulating layer IL1 may be between the semiconductor layer SM and the substrate 110, the semiconductor layer SM may be between the insulating layer IL1 and the insulating layer IL2, the insulating layer IL2 may be between the semiconductor layer SM and the first conductive layer CL1, the first conductive layer CL1 may be between the insulating layer IL2 and the insulating layer IL3, the insulating layer IL3 may be between the first conductive layer CL1 and the second conductive layer CL2, the second conductive layer CL2 may be between the insulating layer IL3 and the insulating layer IL4, and the insulating layer IL4 may be between the second conductive layer CL2 and the insulating layer IL5, but not limited thereto. Note that the insulating layer IL1, the insulating layer IL2, the insulating layer IL3, the insulating layer IL4 and the insulating layer IL5 may be a single-layer insulating film or a multi-layer insulating film individually.

The insulating layer IL1, the insulating layer IL2, the insulating layer IL3, the insulating layer IL4 and the insulating layer IL5 may individually include suitable material. In some embodiments, the material of the insulating layer IL5 may be different from the material of the insulating layer IL1, the material of the insulating layer IL2, the material of the insulating layer IL3 and the material of the insulating layer IL4. For example, the insulating layer IL5 may include organic insulating material (e.g., polymer material), the insulating layer IL1, the insulating layer IL2, the insulating layer IL3 and the insulating layer IL4 may include inorganic insulating material, and the material of the insulating layer IL1, the material of the insulating layer IL2, the material of the insulating layer IL3 and the material of the insulating layer IL4 may be the same or different, but not limited thereto.

In FIG. 2, the aforementioned layers in the circuit component layer 120 may be configured to form the switching component 122, the capacitor, the conductive trace and/or the driving circuit. In some embodiments (as shown in FIG. 2), the switching component 122 may be a top gate thin film transistor, the semiconductor layer SM may include a channel layer of the switching component 122, the insulating layer IL2 may include a gate insulating layer of the switching component 122, the first conductive layer CL1 may include the gate GE of the switching component 122, and the second conductive layer CL2 may include the source SE and the drain DE of the switching component 122, but not limited thereto. In this embodiment, the channel layer is a portion of the semiconductor layer SM overlapping the gate GE. In some embodiments (as shown in FIG. 2), the scan line of the conductive trace may be included in the first conductive layer CL1, and the data line of the conductive trace may be included in the second conductive layer CL2, but not limited thereto. In some embodiments, the data line may be included in the first conductive layer CL1, and the scan line may be included in the second conductive layer CL2. For example, in the circuit component layer 120 of some embodiments, the insulating layer IL1 may be a multi-layer structure including all insulating layers between the semiconductor layer SM and the substrate 110, and the insulating layer IL2 may be a multi-layer structure including all insulating layers between the semiconductor layer SM and the first conductive layer CL1, but not limited thereto.

The driving circuit may be disposed in the peripheral region PR and connected to the conductive trace (e.g., the scan line or the data line). In some embodiments, the conductive layer(s), the insulating layer (s) and the semiconductor layer (s) SM of the circuit component layer 120 may form the driving circuit, but not limited thereto. In some embodiments, the driving circuit may be such as an integrated circuit (IC), such that the driving circuit may be disposed on the substrate 110 through a bonding process and electrically connected to other conductive component (e.g., the conductive trace) in the circuit component layer 120 through at least one conductive element (e.g., solder and/or bonding pad).

The forming method of the aforementioned layers in the circuit component layer 120 may be adjusted based on requirement(s). For instance, these layers may be formed by at least one semiconductor process (e.g., a deposition process, a coating process, an etch process and/or a photolithography), but not limited thereto.

In the circuit component layer 120 shown in FIG. 2, the light emitting component 124 may be disposed on the insulating layer IL5. For instance, in FIG. 2, the light emitting component 124 may include an electrode EL1, an electrode EL2 (included in a third conductive layer CL3) and a light emitting layer LM disposed between the electrode EL1 and the electrode EL2, but not limited thereto. In this embodiment, the third conductive layer CL3 may include transparent conductive material. In some embodiments, the third conductive layer CL3 may include opaque conductive material. Note that the forming method of the light emitting component 124 may be adjusted based on requirement(s) and/or the type of the light emitting component 124. In some embodiments, the forming method of the light emitting component 124 may include at least one semiconductor process (e.g., a deposition process, a coating process, an etch process and/or a photolithography) for example, but not limited thereto. In some embodiments, the light emitting component 124 may be disposed by a bonding process for example, but not limited thereto.

Moreover, in FIG. 2, the circuit component layer 120 may optionally include a pixel defining layer PDL disposed between two light emitting components 124 or between two electrodes EL1, so as to separate the light emitting components 124. The pixel defining layer PDL may be a single-layer structure or a composite structure, and may include an insulating material (organic insulating material or inorganic insulating material), a reflective material, other suitable material(s) or a combination thereof, but not limited thereto. In some embodiments, the light emitting portion of the sub-pixel SP may be determined by a portion of the electrode EL1 exposed by the pixel defining layer PDL, but not limited thereto.

In the present disclosure, the display device 100 may further include a sensing device 140 configured to sense the external information (such as, but not limited to, the light), and the sensing device 140 may be disposed at any suitable position. For instance, in FIG. 2, the sensing device 140 may be disposed on a side of the substrate 110 opposite to the light emitting component 124 (i.e., the substrate 110 is between the sensing device 140 and the light emitting component 124), and the sensing device 140 is configured to sense the external light emitting from a side of the substrate 110 the same as the light emitting component 124 (i.e., the sensing device 140 senses the external light emitting from top to bottom in FIG. 2), but not limited thereto.

The sensing device 140 may include at least one sensing element 142 configured to perform the sensing function. For example, if the sensing device 140 is configured to sense the external light, the sensing element 142 in the sensing device 140 may be a light sensing element, so as to receive the external light to generate a corresponding electrical signal, thereby achieving the function of sensing the external light. In some embodiments, the sensing element 142 serving as the light sensing element may be configured to sense visible light, infrared light, other suitable light or a combination thereof, but not limited thereto. For instance, the sensing device 140 may include one sensing element 142 or a plurality of sensing elements 142 configured to sense the visible light and/or the infrared light, but not limited thereto. For example, the sensing device 140 may include a plurality of sensing elements 142, at least one of the sensing elements 142 may be configured to sense the visible light, and at least another one of the sensing elements 142 may be configured to sense the infrared light, but not limited thereto. In some embodiments, the sensing device 140 having the sensing element 142 serving as the light sensing element may perform a camera function for example, but not limited thereto. In some embodiments, the sensing element 142 may sense the change of the capacitance or the ultrasonic, but not limited thereto. In some embodiments, the sensing device 140 may provide a camera function, a photography function or a biometric identification function (e.g., fingerprint identification). For instance, the sensing device 140 may include an optical camera or an infrared sensor. In other embodiment, the sensing device 140 may further include a flash light, an infrared light source, other sensing device, other electronic component or a combination thereof, but not limited thereto.

In the present disclosure, a region which overlaps between the display region DR and a region surrounded by outermost peripheries of the sensing element(s) 142 of the sensing device 140 in the direction Z may be the sensing area SR. In some embodiments, a sensing range may be greater than the sensing area SR, but not limited thereto. For instance, in some embodiments, the display device 100 may further include an optical structure (not shown in figures), wherein a reflected light of a fingerprint emitting to a region not overlapping the sensing element 142 may be reflected or guided to a region overlapping the sensing element 142 by the optical structure, such that the sensing range may be greater than the sensing area SR. Namely, due to the existence of the optical structure, a region not overlapping the sensing element 142 may have the sensing function. The optical structure may be such as a light guide plate, a cover layer with special optical design or other suitable optical structure, but not limited thereto. In some embodiments, a measuring method of an area of the sensing range may include following steps. First step: the display device 100 can be touched several times with an object having simulated fingerprint features or fingerprint features, such that the display device 100 may generate several sensing result patterns, wherein some of the sensing result patterns may be correct sensing results, and some of the sensing result patterns may be failed or incorrect sensing results. Second step: the identification process may be performed to find or confirm the correct sensing result pattern. Third step: the sensing range may be defined by a maximum area enclosed by connecting lines between center points of the correct sensing result patterns. If the boundary of the sensing range defined by the third step is irregular, it is recommended to find at least one correct sensing result pattern within each centimeter to define a center point within each centimeter, so as to obtain the connection line and precisely define the boundaries of the sensing range.

In the present disclosure, the sensing area SR has the sub-pixel SP2 to display the image, and the external light passes through the structure of the sensing area SR to irradiate the sensing element 142 of the sensing device 140, thereby sensing the external light. Thus, the sensing area SR may perform the display function and the sensing function. Since the external light is difficult to pass through the sub-pixel SP2 directly, a region in the sensing area SR where the sub-pixel SP2 is not disposed should be designed to have a light penetrating structure allowing the penetration of the external light, so as to make the external light irradiate the sensing element 142. In the present disclosure, in order to make the external light penetrate the light penetrating structure and decrease the drop of the light intensity of the external light during penetrating the light penetrating structure (i.e., the sensing element 142 may receive the external light with higher light intensity, as shown in FIG. 1 and FIG. 2, the circuit component layer 120 may have a recess region RS between two sub-pixels SP2. Because of the existence of the recess region RS, a density of the sub-pixels SP2 in the sensing area SR may be less than a density of the sub-pixels SP1 outside the sensing area SR. Namely, a number of the sub-pixels SP2 in a predetermined area of the sensing area SR may be less than a number the sub-pixels SP1 in the same predetermined area outside the sensing area SR, but not limited thereto.

In the present disclosure, at least one layer in the circuit component layer 120 may include a through hole, and a region where these through holes overlapped with each other is referred as the recess region RS, wherein the number of the through holes of each layer may be designed based on requirement(s) (the number of the through holes of each layer may be one or more than one). In the present disclosure, the term "through hole" means a hole passing through one layer or a plurality of layers, the through hole of the layer A1 means a hole passing through the layer A1, and the through hole of the layer A1 and the layer A2 means a hole passing through the layer A1 and the layer A2 simultaneously. Since the layer of the present disclosure may be a single-layer film or a multi-layer film, the through hole of the layer A1 may be a through hole of the single-layer insulating film or a through hole of the multi-layer insulating film based on the type of the layer A1.

In detail, the insulating layer IL1, the insulating layer IL2, the insulating layer IL3, the insulating layer IL4 and the insulating layer IL5 in the circuit component layer 120 may individually have a through hole, and these through holes may be overlapped to each other. Furthermore, in some embodiments (as shown in FIG. 2), the pixel defining layer PDL of the circuit component layer 120 may have a through hole also, so as to reduce the number of the layer(s) in the recess region RS of the circuit component layer 120, but not limited thereto. Moreover, in some embodiments (as shown in FIG. 2), the first conductive layer CL1, the second conductive layer CL2, the light emitting component 124 and the semiconductor layer SM of the circuit component layer 120 may not be disposed in the recess region RS for instance, so as to reduce the number of the layer(s) in the recess region RS of the circuit component layer 120, but not limited thereto.

In the present disclosure, the through holes of each layer in the circuit component layer 120 may be formed by any suitable process, such as an etch process (e.g., a dry etch process and/or a wet etch process). Furthermore, the through holes of each layer in the circuit component layer 120 may be formed in the same process or different processes based on the materials of the layers and/or other requirement(s) (e.g., a pattern of the through hole). For instance, in some embodiments (as shown in FIG. 2), the through hole of the insulating layer IL1, the through hole of the insulating layer IL2, the through hole of the insulating layer IL3 and the through hole of the insulating layer IL4 may be formed by the same process, the through hole of the insulating layer IL5 and the through hole of the pixel defining layer PDL may be formed by another process, and the through hole of the third conductive layer CL3 may be formed by still another process, but not limited thereto. In some embodiments (not shown in figures), the through holes of each layer in the circuit component layer 120 may be formed by the same process (e.g., a dry etch process), but not limited thereto. Since the through holes of each layer shown in FIG. 2 are etched from top to bottom (a direction opposite to the direction Z), in each layer shown in FIG. 2, an upper edge dimension (e.g., an upper edge width) of the through hole may be greater than or equal to a lower edge dimension (e.g., a lower edge width) of the through hole, but not limited thereto.

Figure 4:
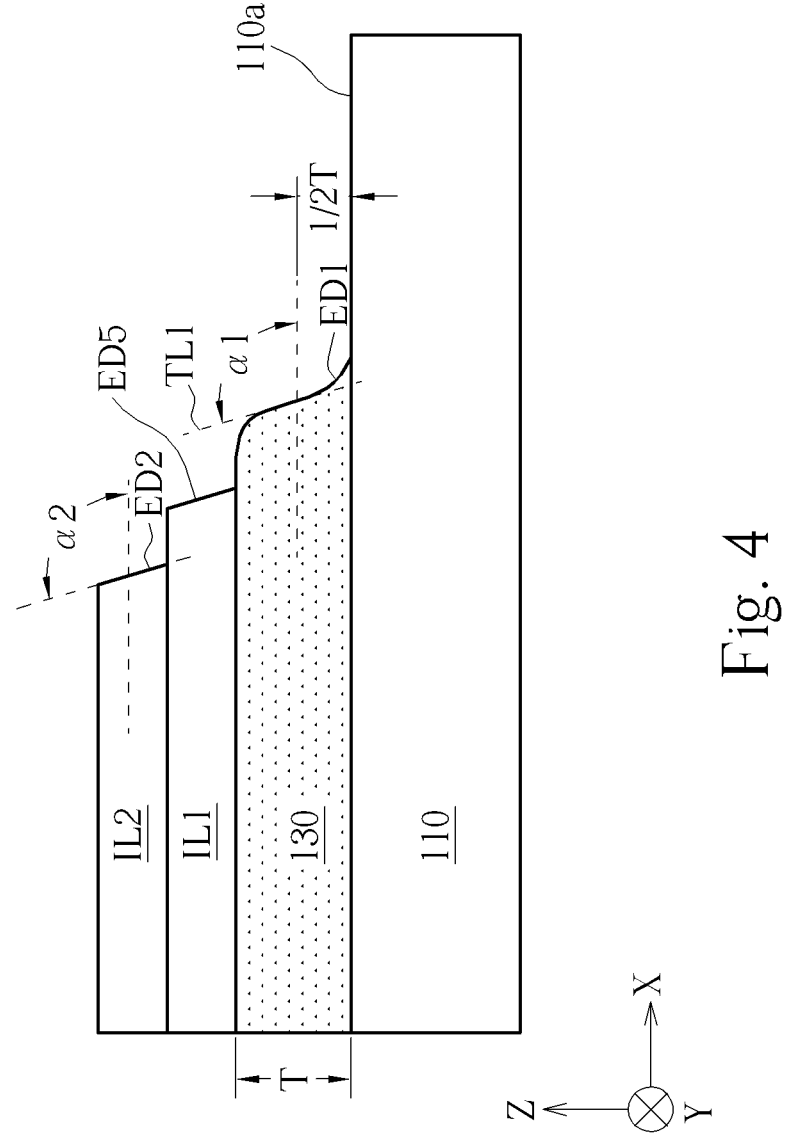
FIG. 4 is a schematic diagram showing a cross-sectional view of a light shielding layer and insulating layers according to an embodiment of the present disclosure.

In some embodiments, when the through holes of the layers including the same material are formed by the same process, the edges of the through holes of these layers may be connected to each other, and the angles respectively between these edges and a surface 110a of the substrate 110 may be the same or similar (e.g., a difference between two angles may be less than 5 degrees, 3 degrees or 1 degree), but not limited thereto. Note that the surface 110a of the substrate 110 may be parallel to the horizontal direction (i.e., parallel to the direction X and the direction Y). Referring to FIG. 4, when the edge of the through hole of the layer/film (e.g., the single-layer film or the multi-layer film) is not straight, the angle between the edge of the through hole of this layer/film and the surface 110a of the substrate 110 is defined as an angle (e.g., an angle $\alpha 1$) between a tangent line (e.g., a tangent line TL1) of the edge of the through hole at the position at half the thickness T of the layer/film (i.e., the position at ½T shown in FIG. 4) and the surface 110a of the substrate 110.

Referring to FIG. 2, the display panel DP may include a light shielding layer 130 disposed between the semiconductor layer SM and the substrate 110 (e.g., the light shielding layer 130 is disposed between the semiconductor layer SM and the sensing element 142). In the present disclosure, the light shielding layer 130 may include any suitable material (e.g., metal, photoresist, ink, resin, pigment or a combination thereof), such that the light transmittance of the light shielding layer 130 may be less than 40% or less than 20%. For instance, the light shielding layer 130 may include metal, but not limited thereto. Accordingly, the light intensity of the reflected light irradiating the channel layer of the switching element 122 may be reduced (the reflected light is caused by the reflection of the external light), or the probability of the shift of the threshold voltage of the switching element 122 may be reduced, so as to enhance the display quality. The light transmittance of the present disclosure means a percentage of a light intensity of a transmitted light of the light shielding layer 130 (an ambient light penetrates the light shielding layer 130 to form the transmitted light) divided by a light intensity of the ambient light before penetrating the light shielding layer 130. The term "light intensity" of the present disclosure means a spectral integral value of a light source (e.g., the ambient light). In some embodiments, the light source may include the visible light (e.g., the wavelength ranges from 380 nm to 780 nm) or the ultraviolet light (e.g., the wavelength is less than 365 nm), but not limited thereto. That is, when the light source is the visible light, the light intensity is the spectral integral value in the wavelength range from 380 nm to 780 nm.

In the present disclosure, based on requirement(s), the light shielding layer 130 may overlap at least a portion of the sub-pixel SP2, so as to overlap at least a portion of the channel layer of the switching component 122. In some embodiments, as shown in FIG. 2, the light shielding layer 130 may overlap the sub-pixel SP2 in the sensing area SR, and may not overlap the sub-pixel SP1 outside the sensing area SR (i.e., the light shielding layer 130 may be disposed in the sensing area SR of the display region DR, and may not be disposed in a region of the display region DR outside the sensing area SR), but not limited thereto.

Similarly, the light shielding layer 130 may have a first through hole TH1 in the sensing area SR, and the first through hole TH1 may overlap the through holes of each layer in the circuit component layer 120, such that the external light may pass through the recess region RS of the circuit component layer 120 and irradiate the sensing element 142 of the sensing device 140. In the cross section view of the display panel DP (as shown in FIG. 2 and FIG. 3), the first through hole TH1 has a first edge ED1.

In the cross section view of the display panel DP, a dimension of the first through hole TH1 (e.g., a width along the direction X or an area viewing from the direction Z, but not limited thereto) and dimensions of the through holes of each layer of the circuit component layer 120 in the sensing area SR may be designed based on requirement(s). In some embodiments (as shown in FIG. 2), in the sensing area SR, a second through hole TH2 of the insulating layer IL2 and the first through hole TH1 of the light shielding layer 130 are overlapped with each other, the second through hole TH2 of the insulating layer IL2 has a second edge ED2 which is closer to the first edge ED1 of the first through hole TH1, and a first distance D1 between the first edge ED1 and the second edge ED2 is greater than 0, but not limited thereto. For example, the first distance D1 between the first edge ED1 and the second edge ED2 may be greater than 0 and less than 5 μm, or greater than 0 and less than 3 μm, but not limited thereto. Note that "a distance between two edges" of the present disclosure means a horizontal distance (i.e., the distance in the horizontal direction) between two positions respectively belonging these two edges and closest to the substrate 110 (i.e., this position is at the bottom of the edge).

In the present disclosure, since the first distance D1 between the first edge ED1 and the second edge ED2 is greater than 0 to make the first edge ED1 be misaligned with the second edge ED2 in the cross section view, a diffraction caused by the external light passing through the first through hole TH1 and the second through hole TH2 may be reduced, thereby reducing the sensing problem caused by the diffraction. For instance, the light shielding layer 130 may block a part of the noise light with phase shift generated by the diffraction, so as to improve the sensing accuracy and/or the sensing clearness of the sensing element 142. In addition, according to this design, the chance that the light refracting several times irradiates the sensing element 142 may be reduced, so as to improve the sensing accuracy and/or the sensing clearness of the sensing element 142.

In some embodiments (as shown in FIG. 2 and FIG. 3), the dimension of the first through hole TH1 may be less than the dimension of the second through hole TH2, so as to decrease the chance that the sensing element 142 receives the noise light, thereby improving the sensing accuracy and/or the sensing clearness of the sensing element 142. For example, in FIG. 2 and FIG. 3, the area of the first through hole TH1 may be less than the area of the second through hole TH2 (the areas are viewed along the direction Z), but not limited thereto. For instance, in FIG. 2 and FIG. 3, a first maximum width W1 of the first through hole TH1 may be less than a second maximum width W2 of the second through hole TH2, but not limited thereto. In some embodiments, because the first distance D1 between the first edge ED1 and the second edge ED2 may be greater than 0 and less than 5 μm or may be greater than 0 and less than 3 μm, the diffraction may be reduced and the sensing element 142 has the well sensing quality. For instance, a ratio of the dimension of the first through hole TH1 to the dimension of the second through hole TH2 (or the dimension of the sub-pixel SP) may be greater than or equal to 65%, or may be greater than or equal to 79%, but not limited thereto.

In some embodiments (as shown in FIG. 2), in the cross section view of the display panel DP, a third through hole TH3 of the insulating layer IL5 in the sensing area SR (the third through hole TH3 and the second through hole TH2 of the insulating layer IL2 are overlapped with each other, or the third through hole TH3, the first through hole TH1 of the light shielding layer 130 and the second through hole TH2 of the insulating layer IL2 are overlapped with each other) may have a third edge ED3 which is closer to the first edge ED1 of the first through hole TH1, and a second distance D2 between the first edge ED1 and the third edge ED3 may be greater than 0, but not limited thereto. In some embodiments (as shown in FIG. 2), in the cross section view of the display panel DP, the first maximum width W1 of the first through hole TH1 may be less than a third maximum width W3 of the third through hole TH3, but not limited thereto.

In some embodiments (as shown in FIG. 2), in the cross section view of the display panel DP, a fourth through hole TH4 of the third conductive layer CL3 in the sensing area SR (e.g., the fourth through hole TH4 overlaps the first through hole TH1 of the light shielding layer 130, the second through hole TH2 of the insulating layer IL2 and the third through hole TH3 of the insulating layer IL5) may have a fourth edge ED4 which is closer to the first edge ED1 of the first through hole TH1, and a third distance D3 between the first edge ED1 and the fourth edge ED4 may be greater than 0, but not limited thereto. In some embodiments (as shown in FIG. 2), in the cross section view of the display panel DP, the first maximum width W1 of the first through hole TH1 may be less than a fourth maximum width W4 of the fourth through hole TH4, but not limited thereto.

In some embodiments (as shown in FIG. 2), in the cross section view of the display panel DP, a fifth through hole TH5 of the insulating layer IL1 in the sensing area SR (e.g., the fifth through hole TH5 overlaps the first through hole TH1 of the light shielding layer 130, the second through hole TH2 of the insulating layer IL2, the third through hole TH3 of the insulating layer IL5 and the fourth through hole TH4 of the third conductive layer CL3) may have a fifth edge ED5 which is closer to the first edge ED1 of the first through hole TH1, and a distance between the first edge ED1 and the fifth edge ED5 may be greater than 0, but not limited thereto. In some embodiments (as shown in FIG. 2), in the cross section view of the display panel DP, the first maximum width W1 of the first through hole TH1 may be less than a fifth maximum width W5 of the fifth through hole TH5, but not limited thereto.

In an embodiment, as shown in FIG. 2, the fourth maximum width W4 of the fourth through hole TH4 of the third conductive layer CL3 is greater than the third maximum width W3 of the third through hole TH3 of the insulating layer IL5, the third maximum width W3 is greater than the second maximum width W2 of the second through hole TH2 of the insulating layer IL2, the second maximum width W2 is greater than the fifth maximum width W5 of the fifth through hole TH5 of the insulating layer IL1, and the fifth maximum width W5 is greater than the first maximum width W1 of the first through hole TH1 of the light shielding layer 130, but not limited thereto.

In some embodiments (as shown in FIG. 2), in the cross section view of the display panel DP, regarding each layer in the circuit component layer 120, the distance between the edge of the through hole which is closer to the first edge ED1 of the first through hole TH1 and the first edge ED1 may be greater than 0, but not limited thereto. In some embodiments (as shown in FIG. 2), in the cross section view of the display panel DP, the first maximum width W1 of the first through hole TH1 may be less than the maximum widths of the through holes in each layers in the circuit component layer 120, but not limited thereto.

Moreover, in the cross section view of the display panel DP, an angle between the edge of the through hole and the surface 110a of the substrate 110 may be designed based on requirement(s). In some embodiments, the angle α1 between the first edge ED1 of the first through hole TH1 of the light shielding layer 130 and the surface 110a of the substrate 110 may be different from the angle between the edge of the through hole of one of the layers in the circuit component layer 120 and the surface 110a of the substrate 110. For instance, as shown in FIG. 4, the angle α1 between the first edge ED1 of the first through hole TH1 of the light shielding layer 130 and the surface 110a of the substrate 110 may be different from the angle α2 between the second edge ED2 of the second through hole TH2 of the insulating layer IL2 and the surface 110a of the substrate 110, but not limited thereto.

In the top view of the display panel DP, the top-view shapes of the through holes of each layer may be designed based on requirement(s), and the top-view shapes of the through holes of each layer may be the same or different. In the present disclosure, the top-view shape of the through hole may be a closed geometric pattern. Namely, the through hole has the edge(s) surrounding itself. For instance, the top-view shape of the through hole may be a polygon (e.g., a triangle, a rectangle or a hexagon) orashapehavingacurved edge (e.g., a circle, an oval or a shape with rounded corners). In FIG. 3, the first through hole TH1 and the second through hole TH2 are the shape with rounded corners, such that the first through hole TH1 has a curved edge Ec1, and the second through hole TH2 has a curved edge Ec2, but not limited thereto. Since the first through hole TH1 has the curved edge Ec1 and/or the second through hole TH2 has the curved edge Ec2, the diffraction problem caused by the external light passing through the first through hole TH1 and the second through hole TH2 may be reduced.

The relation between the dimension of the through hole of the aforementioned layer and the dimension of the sub-pixel SP may be designed based on requirement(s). In some embodiments (as shown in FIG. 3), in the top view, the dimension of the first through hole TH1 of the light shielding layer 130 may be similar to or the same as the dimension of the sub-pixel SP, and/or the dimension of the second through hole TH2 of the insulating layer IL2 may be similar to or the same as the dimension of the sub-pixel SP, but not limited thereto. In this embodiment, the dimension of the sub-pixel may be such as a region surrounded by two adjacent gate lines and two adjacent data lines. In some embodiments, two adjacent gate lines are two gate lines with the same function (e.g., the gate lines are connected to the switching components with the same function), and there is no other gate line with the same function as the these two gate lines between these two gate lines; two adjacent data lines are two data lines with the same function (e.g., the data lines are connected to the switching components with the same function), and there is no other data line with the same function as the these two data lines between these two gate lines, but not limited thereto.

In the present disclosure, the display device 100 may further include other suitable component and/or structure. In some embodiments, the display panel DP may optionally include another substrate (not shown in figures) opposite to the substrate 110, and a filter layer, a light adjustment layer and/or a light blocking layer may be optionally included in the display device 100 and disposed on this another substrate. The light blocking layer may be configured to separate the sub-pixels SP from each other and shield same components, so as to reduce the probability that the external light is reflected by the display device 100, thereby enhancing the display quality, but not limited thereto. The light blocking layer may include metal, photoresist, ink, resin, pigment, other suitable light blocking material or a combination thereof, but not limited thereto. In some embodiments, the display panel DP may further include an optical layer, such as a polarizer and/or an anti-reflection film, disposed at any suitable position, but not limited thereto.

The display device of the present disclosure is not limited to the above embodiments. Further embodiments of the present disclosure are described below. For ease of comparison, same components will be labeled with the same symbol in the following. The following descriptions relate the differences between each of the embodiments, and repeated parts will not be redundantly described.

Figure 5:
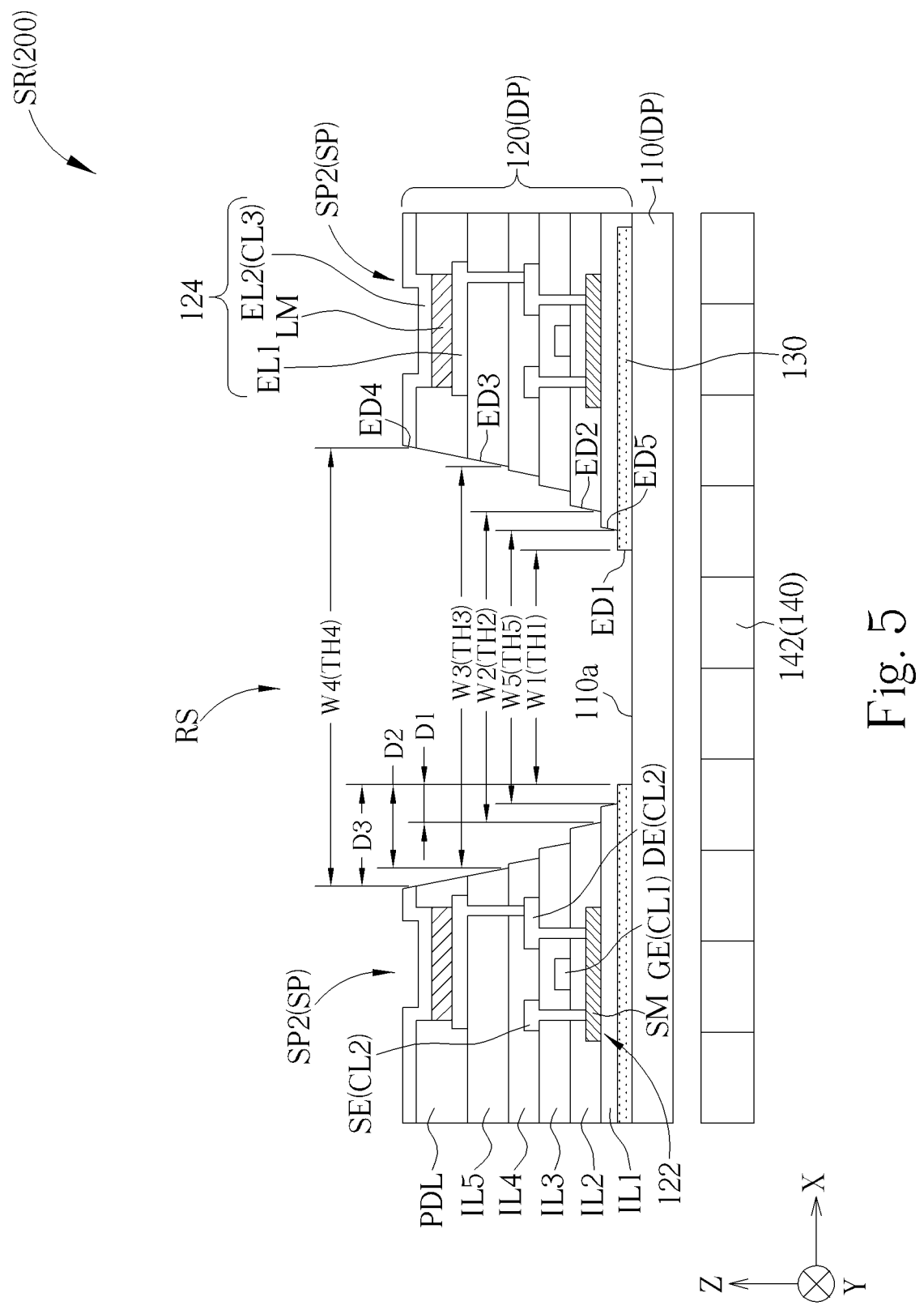
FIG. 5 is a schematic diagram showing a cross-sectional view of a display device according to a second embodiment of the present disclosure.

Referring to FIG. 5, FIG. 5 is a schematic diagram showing a cross-sectional view of a display device according to a second embodiment of the present disclosure. As shown in FIG. 5, a difference between this embodiment and the first embodiment is the edge design of the through hole of the display device 200. In the circuit component layer 120 of FIG. 5, the edge of the through hole (the fifth through hole TH5) of the insulating layer IL1, the edge of the through hole (the second through hole TH2) of the insulating layer IL2, the edge of the through hole of the insulating layer IL3, the edge of the through hole of the insulating layer IL4 and the edge of the through hole (the third through hole TH3) of the insulating layer IL5 are not connected to each other. For example, the through hole of the insulating layer IL1, the through hole of the insulating layer IL2, the through hole of the insulating layer IL3, the through hole of the insulating layer IL4 and the through hole of the insulating layer IL5 may be formed by different processes, but not limited thereto. Moreover, in FIG. 5, the edge of the fourth through hole TH4 of the third conductive layer CL3 may be connected to the edge of the through hole of the pixel defining layer PDL, but not limited thereto. In some embodiments, the angle between the edge of the through hole of the insulating layer IL1 and the surface 110a of the substrate 110, the angle between the edge of the through hole of the insulating layer IL2 and the surface 110a of the substrate 110, the angle between the edge of the through hole of the insulating layer IL3 and the surface 110a of the substrate 110, the angle between the edge of the through hole of the insulating layer IL4 and the surface 110a of the substrate 110, and the angle between the edge of the through hole of the insulating layer IL5 and the surface 110a of the substrate 110 may be different, but not limited thereto. In some embodiments, the angle between the edge of the through hole of the insulating layer IL1 and the surface 110a, the angle between the edge of the through hole of the insulating layer IL2 and the surface 110a, the angle between the edge of the through hole of the insulating layer IL3 and the surface 110a, the angle between the edge of the through hole of the insulating layer IL4 and the surface 110a, and the angle between the edge of the through hole of the insulating layer IL5 and the surface 110a may be different from the angle $\alpha 1$ between the first edge ED1 of the first through hole TH1 of the light shielding layer 130 and the surface 110a, but not limited thereto.

Figure 6:
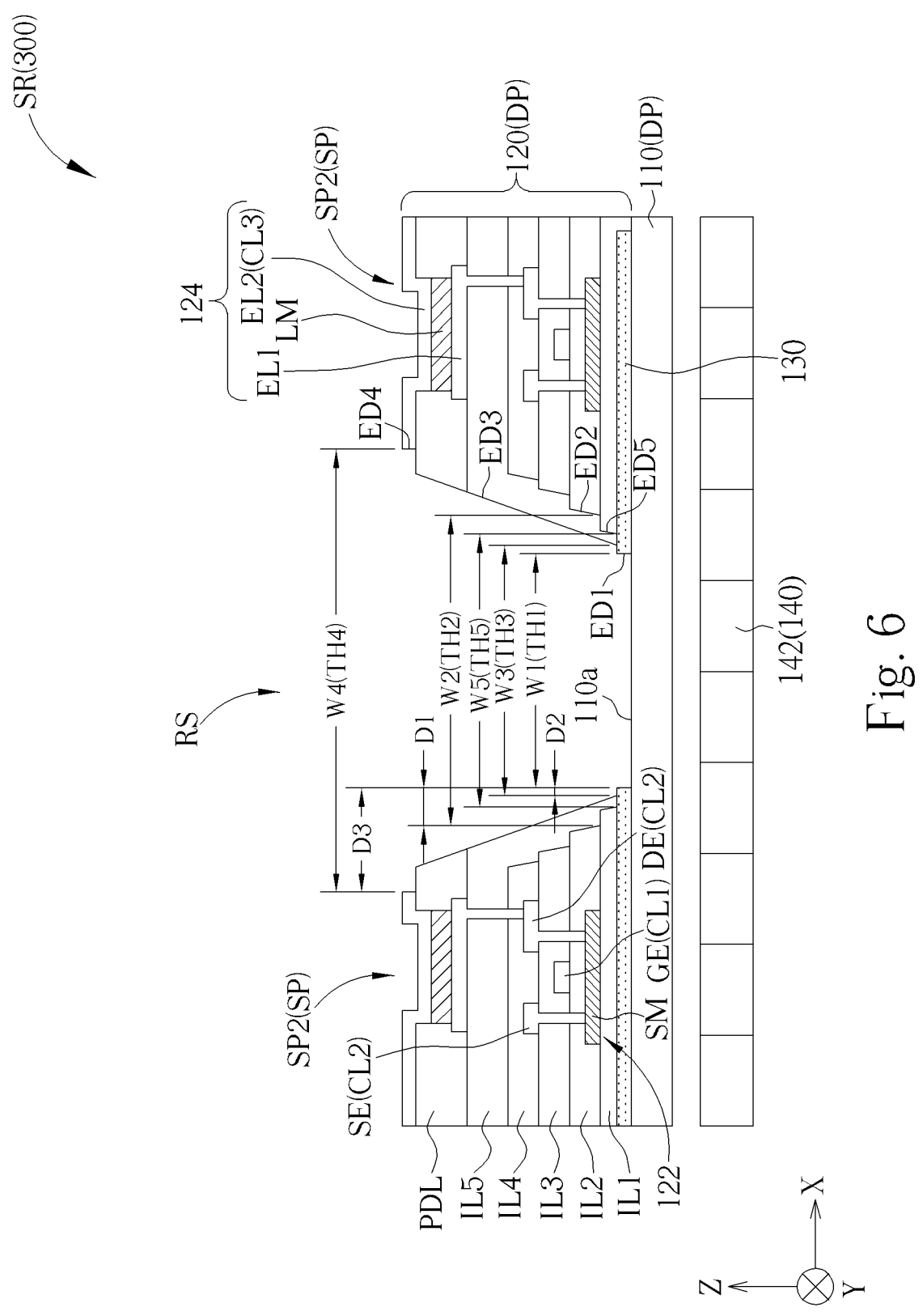
FIG. 6 is a schematic diagram showing a cross-sectional view of a display device according to a third embodiment of the present disclosure.

Referring to FIG. 6, FIG. 6 is a schematic diagram showing a cross-sectional view of a display device according to a third embodiment of the present disclosure. As shown in FIG. 6, a difference between this embodiment and the first embodiment is the edge design of the through hole of the display device 300. In FIG. 6, the insulating layer IL5 covers the edge of the through hole (the fifth through hole TH5) of the insulating layer IL1, the edge of the through hole (the second through hole TH2) of the insulating layer IL2, the edge of the through hole of the insulating layer IL3 and the edge of the through hole of the insulating layer IL4. Thus, the third maximum width W3 of the third through hole TH3 of the insulating layer IL5 is less than the second maximum width W2 of the second through hole TH2 of the insulating layer IL2 and the fifth maximum width W5 of the fifth through hole TH5 of the insulating layer IL1, and the third maximum width W3 of the third through hole TH3 of the insulating layer IL5 is greater than the first maximum width W1 of the first through hole TH1 of the light shielding layer 130, but not limited thereto.

An embodiment of the manufacturing method of the structure shown in FIG. 6 is described below, but the manufacturing method is not limited thereto. In the embodiment of the manufacturing method, after forming the light shielding layer 130, the insulating layer IL1, the insulating layer IL2, the insulating layer IL3 and the insulating layer IL4, an etch process is performed to form the through hole of the insulating layer IL1, the through hole of the insulating layer IL2, the through hole of the insulating layer IL3 and the through hole of the insulating layer IL4. Then, the insulating layer IL5 is formed to cover the edge of the through hole (the fifth through hole TH5) of the insulating layer IL1, the edge of the through hole (the second through hole TH2) of the insulating layer IL2, the edge of the through hole of the insulating layer IL3 and the edge of the through hole of the insulating layer IL4. Thereafter, another etch process is performed to form the third through hole TH3 of the insulating layer IL5.

Figure 7:
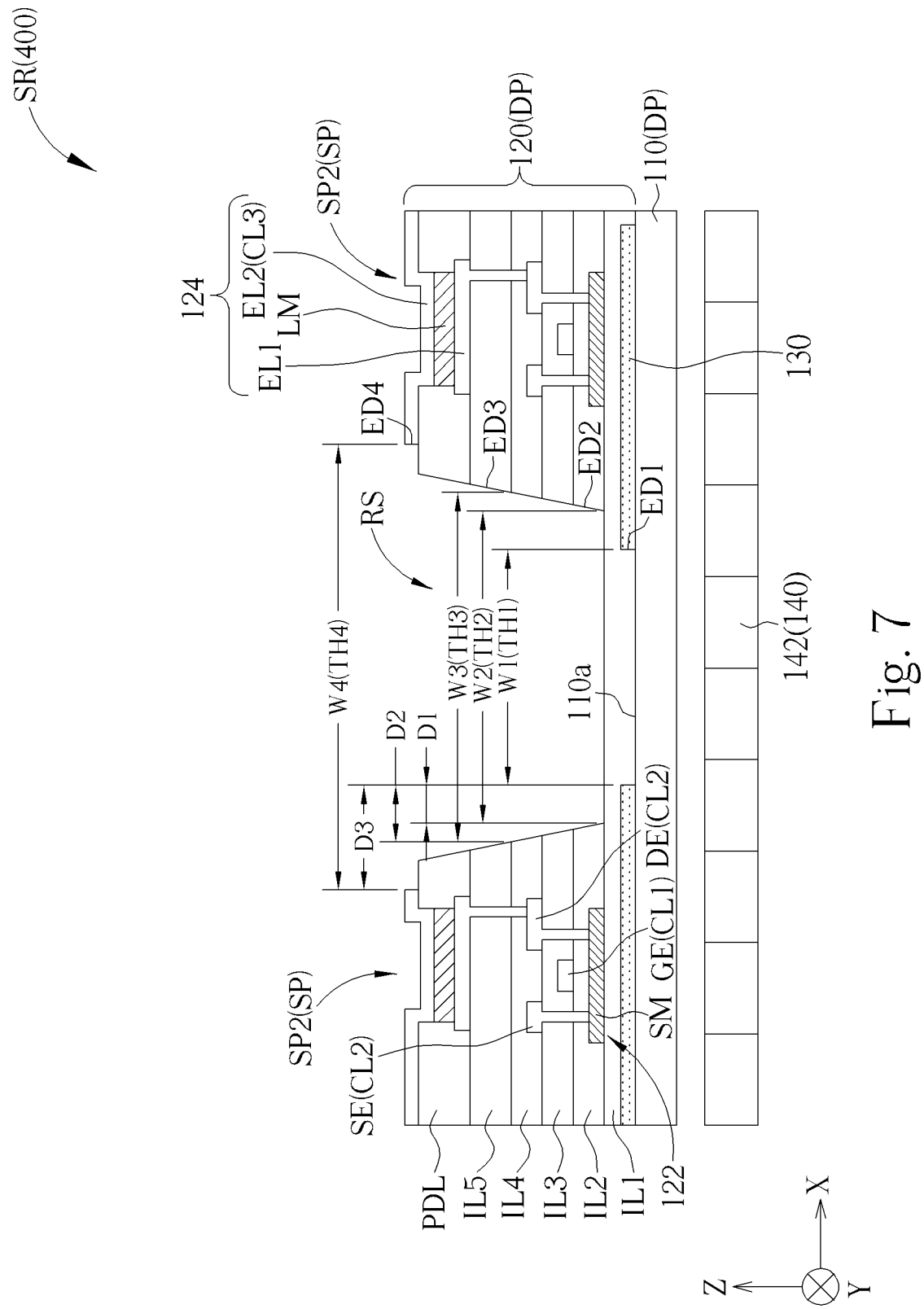
FIG. 7 is a schematic diagram showing a cross-sectional view of a display device according to a fourth embodiment of the present disclosure.

Referring to FIG. 7, FIG. 7 is a schematic diagram showing a cross-sectional view of a display device according to a fourth embodiment of the present disclosure. As shown in FIG. 7, a difference between this embodiment and the first embodiment is that the insulating layer IL1 of the display device 400 of this embodiment does not have the through hole overlapping the through holes of other layers in the sensing area SR. Furthermore, the insulating layer IL1 covers the first through hole TH1 of the light shielding layer 130, such that the light shielding layer 130 may be protected by the insulating layer IL1, so as to decrease the possibility that the light shielding layer 130 is damaged.

Figure 8:
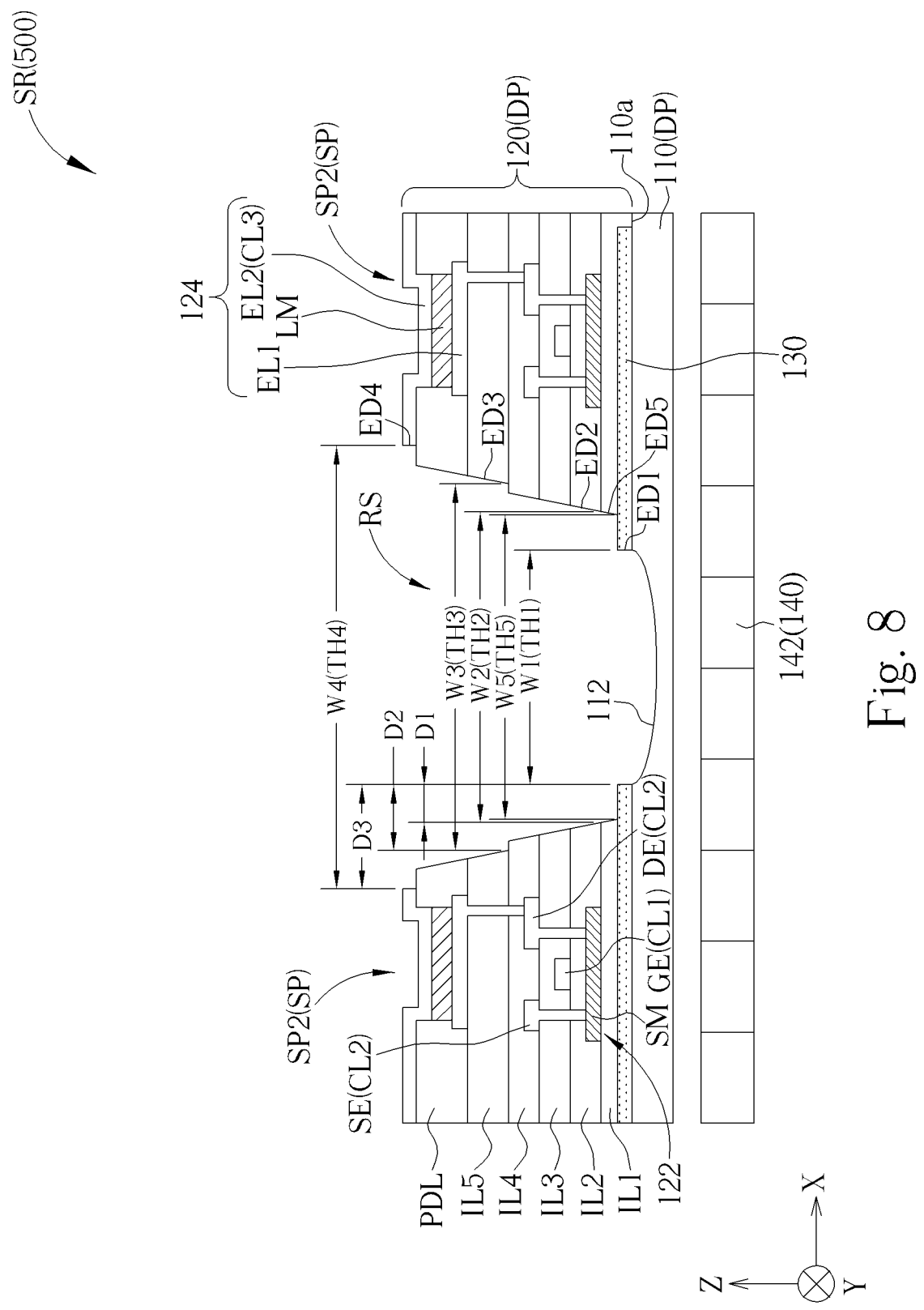
FIG. 8 is a schematic diagram showing a cross-sectional view of a display device according to a fifth embodiment of the present disclosure.

Referring to FIG. 8, FIG. 8 is a schematic diagram showing a cross-sectional view of a display device according to a fifth embodiment of the present disclosure. As shown in FIG. 8, a difference between this embodiment and the first embodiment is the design of the substrate 110 in the sensing area SR of the display device 500. In FIG. 8, the substrate 110 in the sensing area SR has a pattern structure 112 overlapping the recess region RS, wherein the pattern structure 112 of the substrate 110 may be configured to concentrate the external light for example, so as to increase the intensity of the light irradiating the sensing element 142. In some embodiments, the pattern structure 112 of the substrate 110 may be a concave structure with a suitable curved surface, so as to achieve an effect such as a lens. For instance, the curved surface of the pattern structure 112 may be a circular arc surface, a parabolic surface or other suitable curved surfaces, but not limited thereto.

Referring to FIG. 9 to FIG. 13, FIG. 9 to FIG. 13 are schematic diagrams showing a top view of a light shielding layer and an insulating layer according to some embodiments of the present disclosure. Note that, the insulating layer shown in FIG. 9 to FIG. 13 is the insulating layer having the through hole(s) in the sensing area SR, and the insulating layer shown in FIG. 9 to FIG. 13 is the insulating layer IL2 for instance. Note that the top-view relation between the light shielding layer 130 and the insulating layer shown in FIG. 9 to FIG. 13 may be used in any embodiment of the present disclosure.

Figure 9:
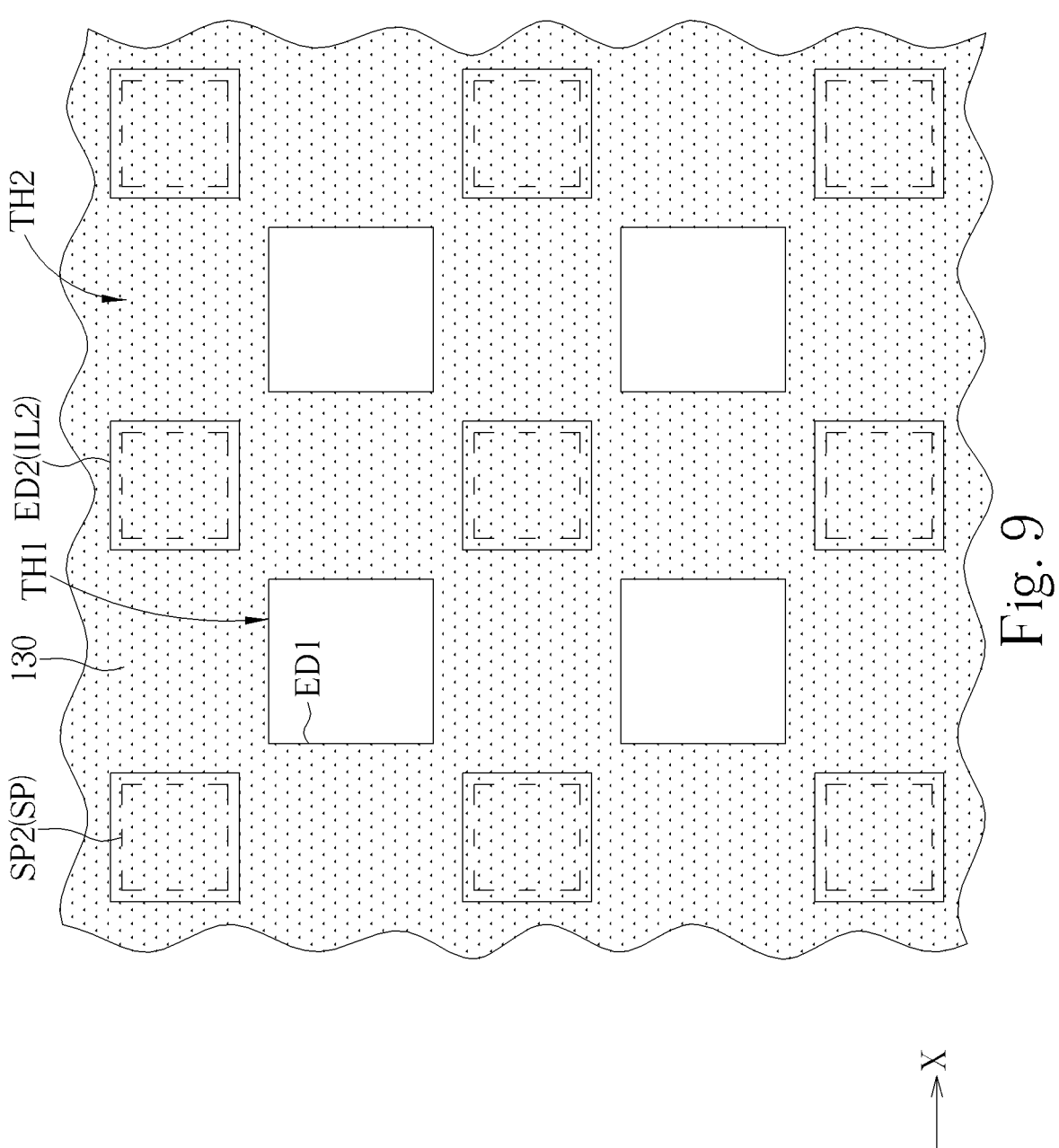
FIG. 9 to FIG. 13 are schematic diagrams showing a top view of a light shielding layer and an insulating layer according to some embodiments of the present disclosure.

In the present disclosure, the light shielding layer 130 may have at least one first through hole TH1 in the sensing area SR, the insulating layer IL2 ma have at least one second through hole TH2 in the sensing area SR, and the number of the first through hole(s) TH1 and the number of the second through hole(s) TH2 may be designed based on requirement (s). In some embodiments (as shown in FIG. 9), the light shielding layer 130 may have a plurality of first through holes TH1 in the sensing area SR, the insulating layer IL2 may have one second through hole TH2 in the sensing area SR, and the second through hole TH2 may overlap the first through holes TH1 to form a plurality of recess regions RS in the sensing area SR (the recess region RS is formed in an overlapping region of one of the first through holes TH1 and the second through hole TH2), but not limited thereto. In FIG. 9, the top-view shape of the second through hole TH2 of the insulating layer IL2 may surround the sub-pixel SP2.

Figure 10:
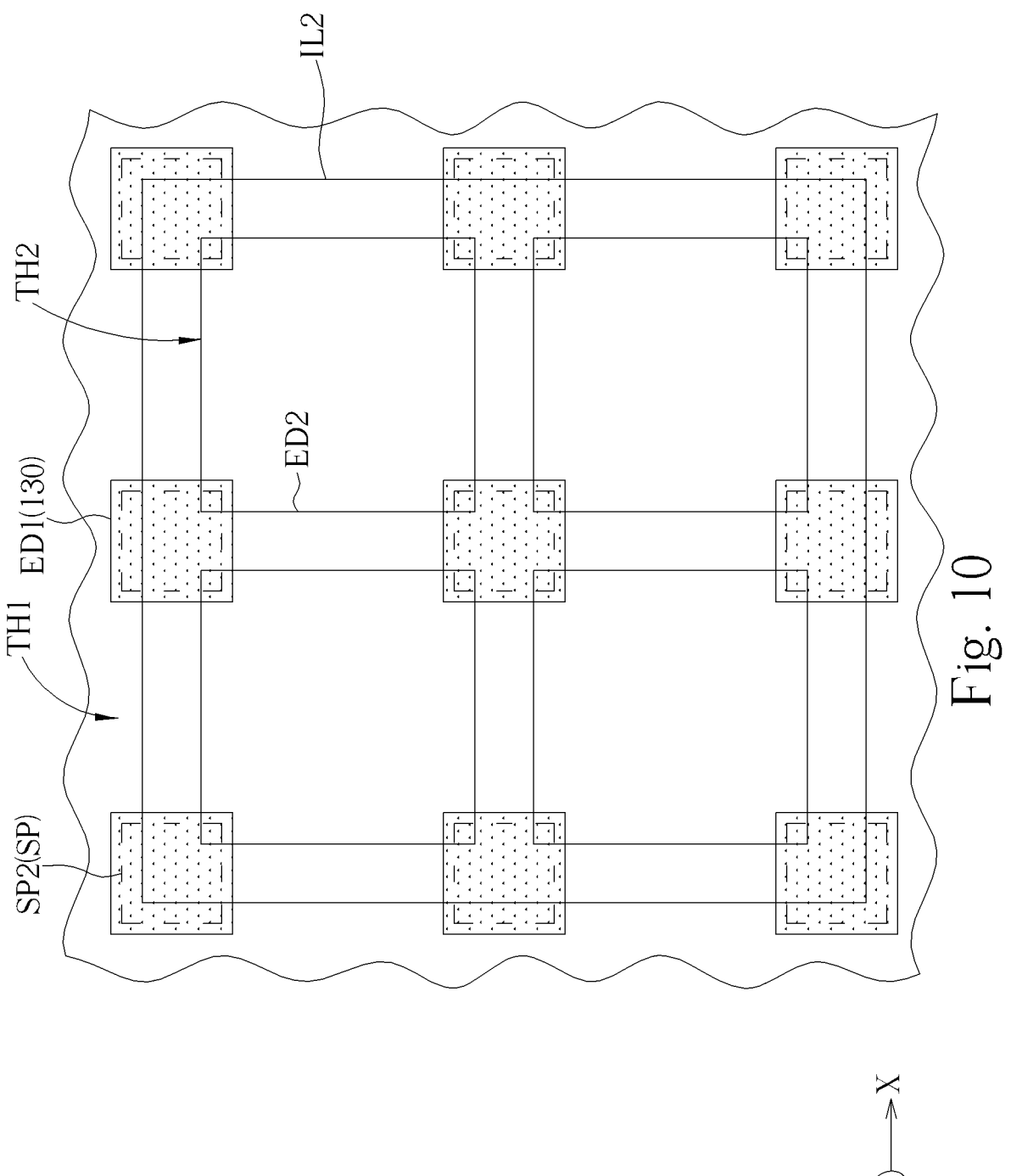

In some embodiments (as shown in FIG. 10), the light shielding layer 130 may have one first through hole TH1 in the sensing area SR, the insulating layer IL2 may have a plurality of second through holes TH2 in the sensing area SR, and the first through hole TH1 may overlap the second through holes TH2 to form a plurality of recess regions RS in the sensing area SR (the recess region RS is formed in an overlapping region of the first through hole TH1 and one of the second through holes TH2), but not limited thereto. In FIG. 10, the top-view shape of the first through hole TH1 of the light shielding layer 130 may surround the sub-pixel SP2.

Figure 11:
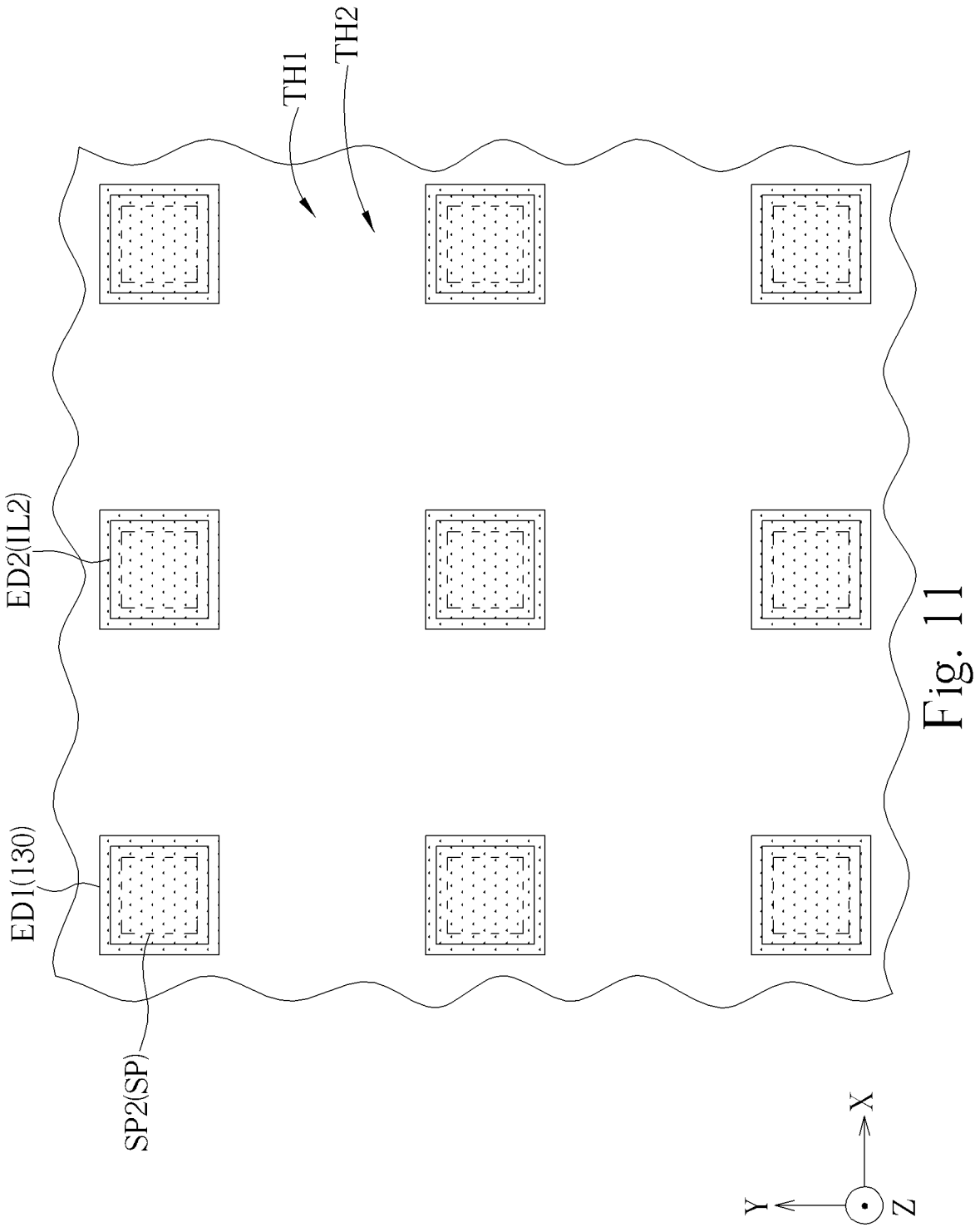

In some embodiments (as shown in FIG. 11), the light shielding layer 130 may have one first through hole TH1 in the sensing area SR, the insulating layer IL2 may have one second through hole TH2 in the sensing area SR, and the first through hole TH1 may overlap the second through hole TH2 to form one recess region RS or a plurality of recess regions RS in the sensing area SR, but not limited thereto. In FIG. 11, the top-view shape of the first through hole TH1 of the light shielding layer 130 and the top-view shape of the second through hole TH2 of the insulating layer IL2 may surround the sub-pixel SP2.

In some embodiments (not shown in figures), the light shielding layer 130 may have a plurality of first through holes TH1 in the sensing area SR, the insulating layer IL2 may have a plurality of second through holes TH2 in the sensing area SR, and the first through holes TH1 may respectively overlap the second through holes TH2 to form a plurality of recess regions RS in the sensing area SR, but not limited thereto. The overlapping relation between the first through holes TH1 and the second through holes TH2 may be designed based on requirement(s). For example, the first through holes TH1 and the second through holes TH2 may overlap in one-to-one correspondence, one-to-many correspondence, many-to-one correspondence or many-to-many correspondence.

Figure 12:
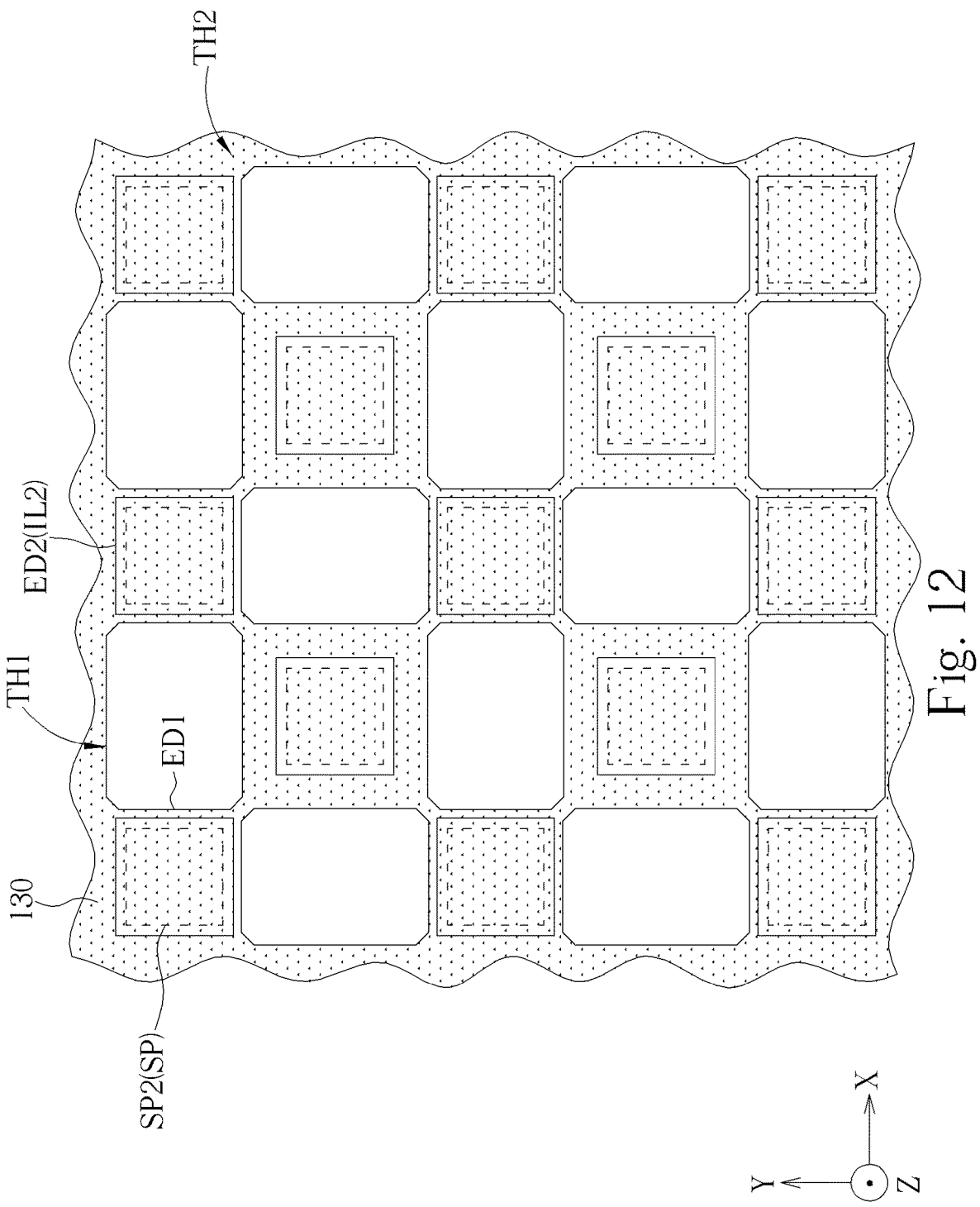

In the present disclosure, the top-view shape of the through hole and the dimension of the through hole may be designed based on requirement(s). In some embodiments (as shown in FIG. 12), the light shielding layer 130 may have a plurality of first through holes TH1 in the sensing area SR, and the insulating layer IL2 may have one second through hole TH2 in the sensing area SR. In FIG. 12, in the top view of the display panel DP, the first through hole TH1 of the light shielding layer 130 may be an octagon, and the top-view shape of the second through hole TH2 of the insulating layer IL2 may surround the sub-pixel SP2, but not limited thereto.

In some embodiments (as shown in FIG. 12), all of the first through holes TH1 are not totally the same. In FIG. 12, there is a 90-degree rotating difference between the top-view shape of the first through holes TH1 in one row and the top-view shape of the first through holes TH1 in another row, but not limited thereto. Since the first through holes TH1 are not totally the same, the diffraction problem caused by the external light passing through the first through hole TH1 and the second through hole TH2 may be reduced.

Figure 13:
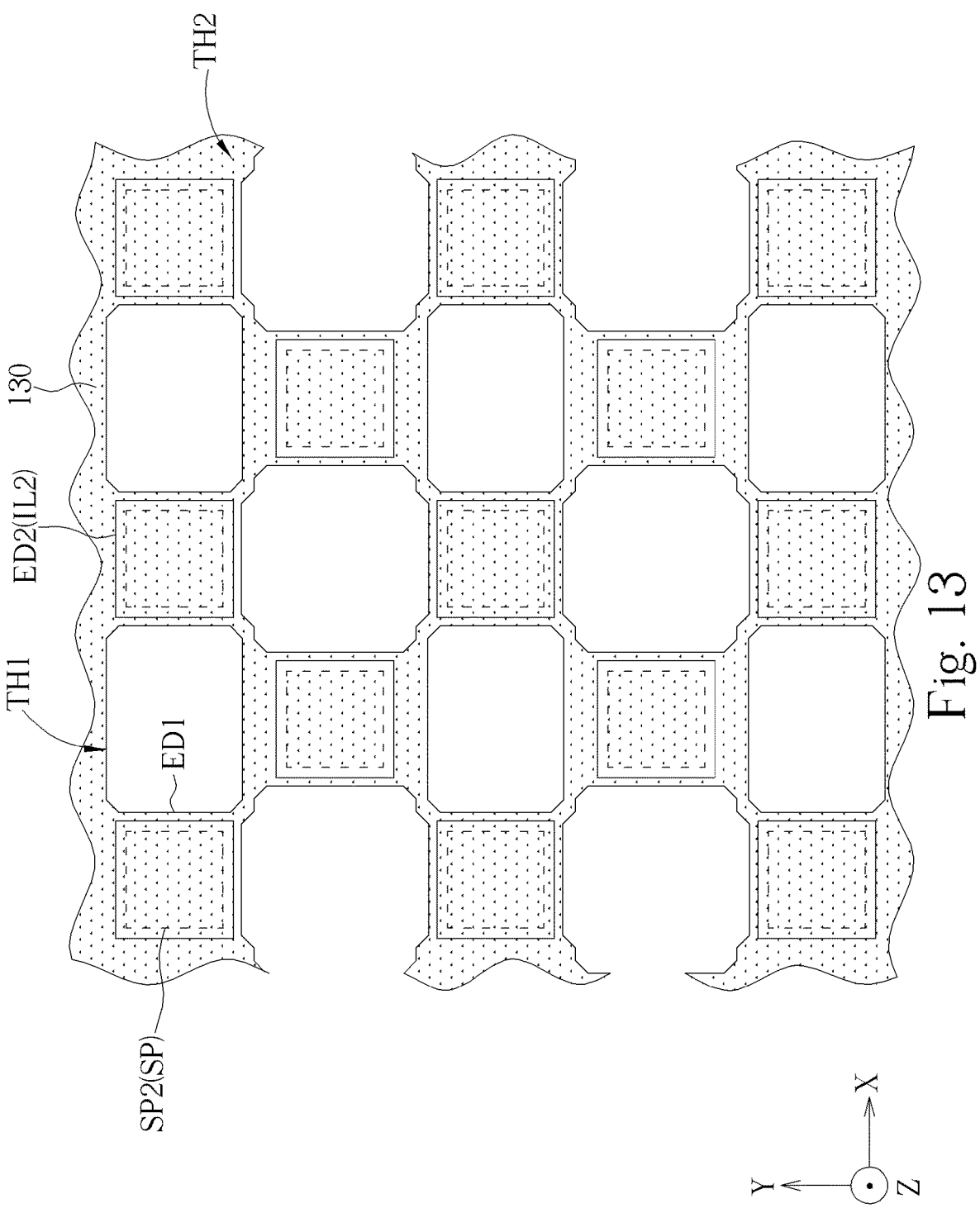

In some embodiments (as shown in FIG. 13), the light shielding layer 130 may have a plurality of first through holes TH1 in the sensing area SR, and the insulating layer IL2 may have one second through hole TH2 in the sensing area SR. In FIG. 13, the top-view shapes of the first through holes TH1 are not totally the same. For example, the top-view shape of the first through holes TH1 in one row may be an octagon, the top-view shape of the first through holes TH1 in another row may be a hexadecagon, but not limited thereto. In some embodiments (as shown in FIG. 13), the area of one of the first through holes TH1 may be different from the area of another one of the first through holes TH1. For instance, the area of the first through hole TH1 with the octagon may be less than the area of the first through hole TH1 with the hexadecagon, but not limited thereto. Since the top-view shapes of the first through holes TH1 are not totally the same, the diffraction problem caused by the external light passing through the first through hole TH1 and the second through hole TH2 may be reduced.

Figure 14:
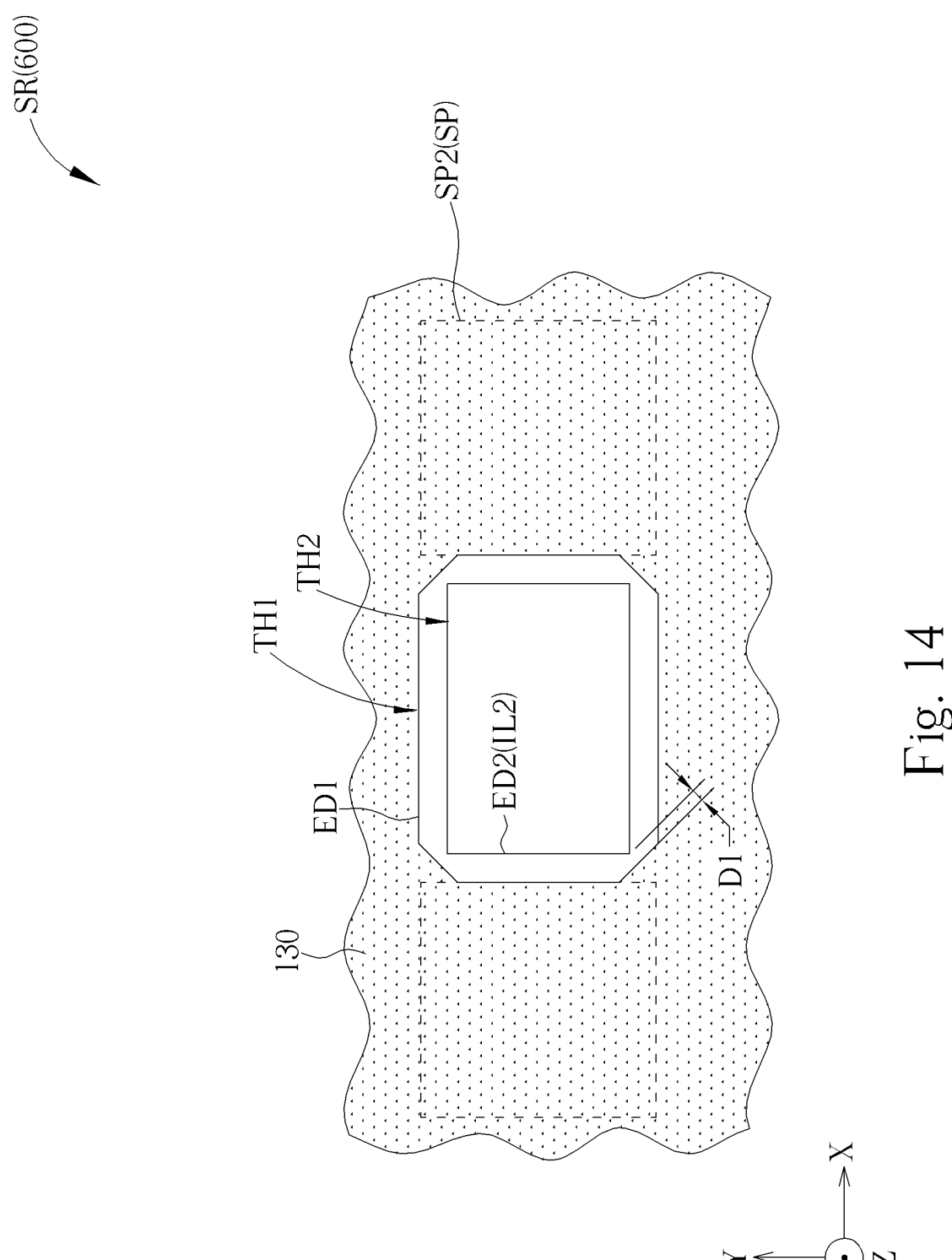
FIG. 14 is a schematic diagram showing a top view of a region of a display device according to a sixth embodiment of the present disclosure.
Figure 15:
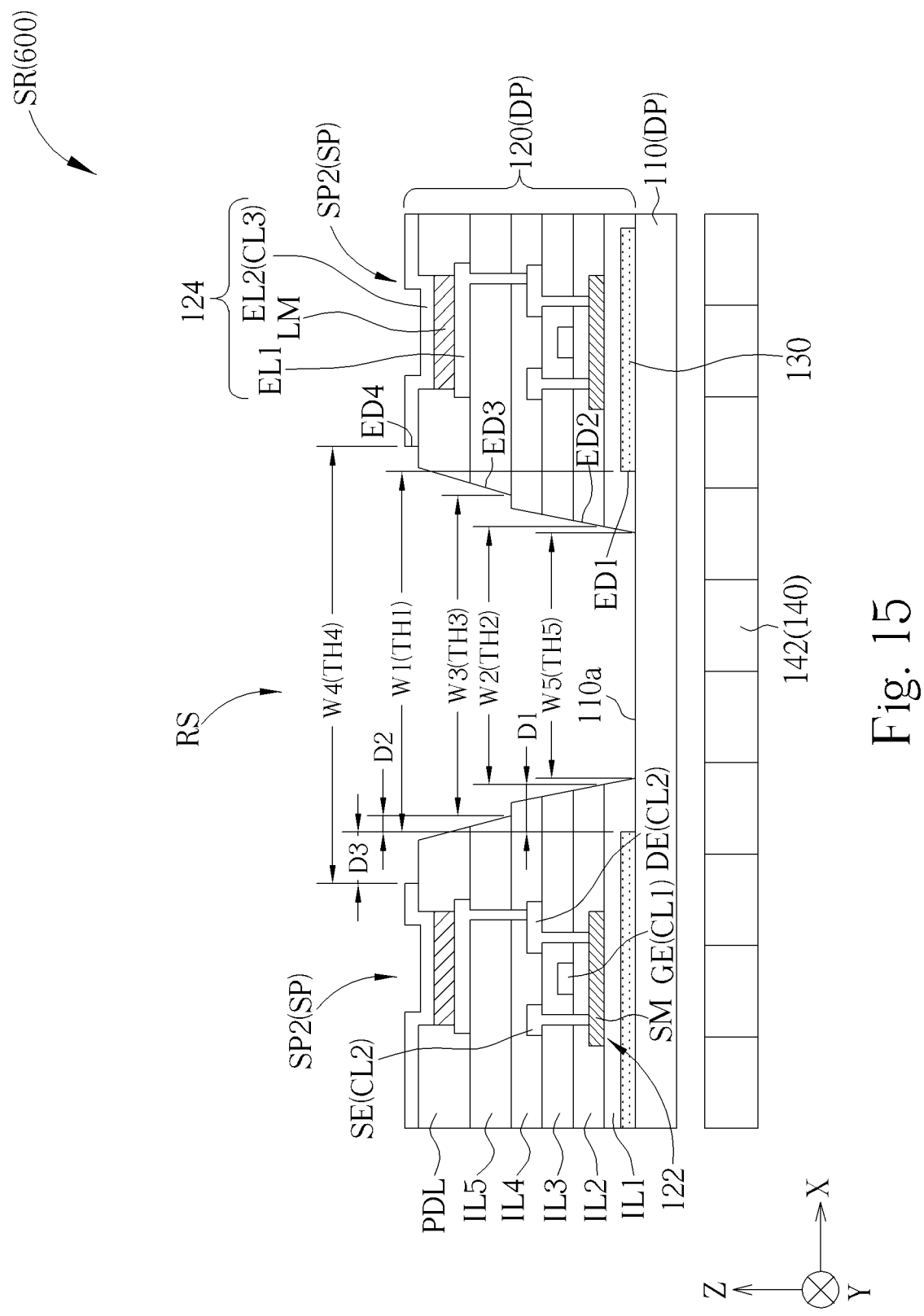
FIG. 15 and FIG. 16 are schematic diagrams showing a cross-sectional view of a display device according to the sixth embodiment of the present disclosure.
Figure 16:
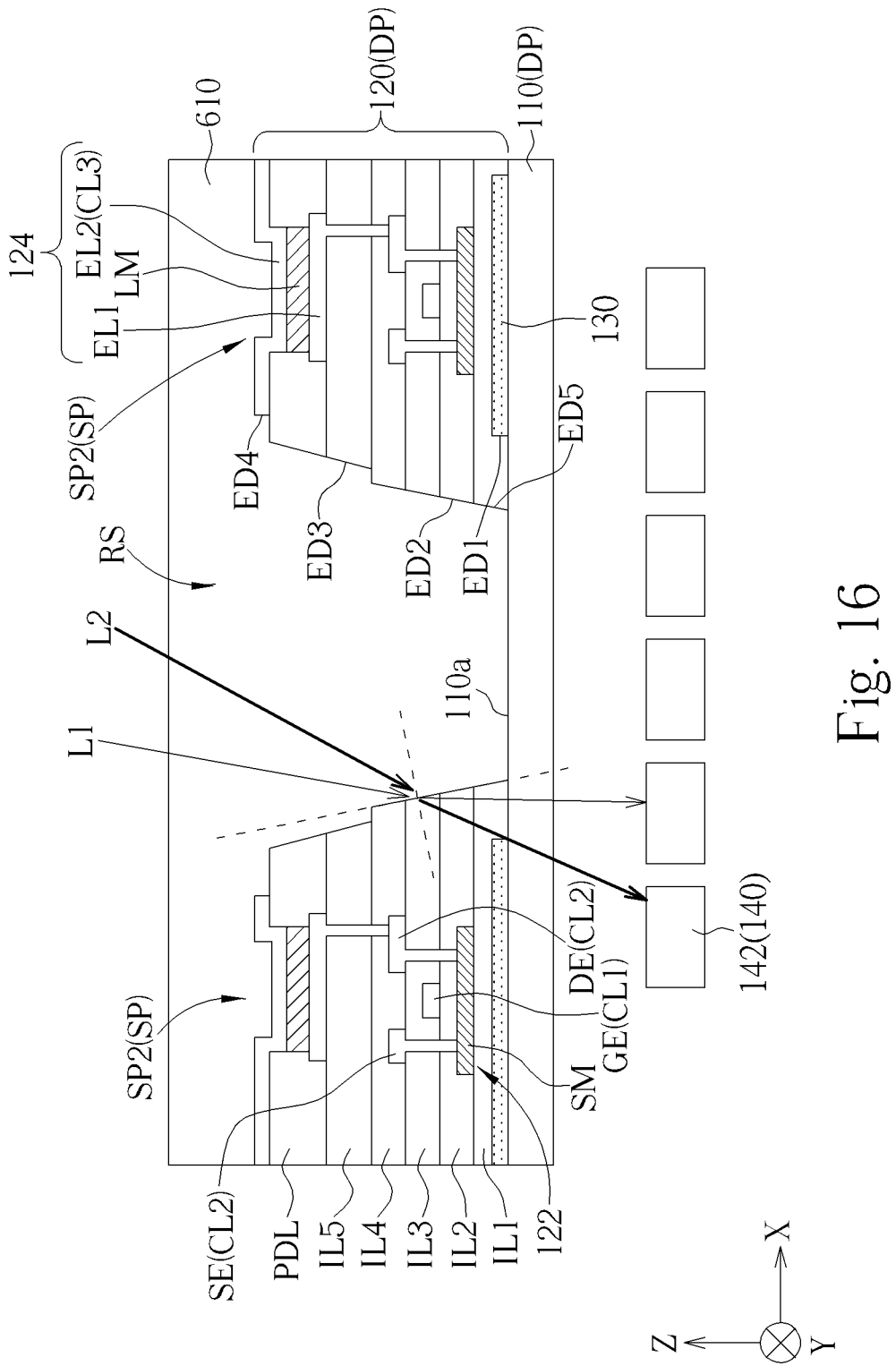

Referring to FIG. 14 to FIG. 16, FIG. 14 is a schematic diagram showing a top view of a region of a display device according to a sixth embodiment of the present disclosure, and FIG. 15 and FIG. 16 are schematic diagrams showing a cross-sectional view of a display device according to the sixth embodiment of the present disclosure. As shown in FIG. 14 and FIG. 15, a difference between this embodiment and the first embodiment is the design of the through hole of the display device 600. In FIG. 14 and FIG. 15, the first distance D1 between the first edge ED1 of the first through hole TH1 of the light shielding layer 130 and the second edge ED2 of the second through hole TH2 of the insulating layer IL2 may be greater than 0, and the dimension of the first through hole TH1 may be greater than the dimension of the second through hole TH2. For instance, in FIG. 14 and FIG. 15, the first maximum width W1 of the first through hole TH1 may be greater than the second maximum width W2 of the second through hole TH2.

As shown in FIG. 14 to FIG. 16, since the dimension of the first through hole TH1 may be greater than the dimension of the second through hole TH2, in the recess region RS, the area through which the external light penetrates is increased (e.g., the aperture ratio is increased), thereby increasing the intensity of the external light irradiating to the sensing element 142. For instance, in FIG. 16, in addition to the external light (e.g., the light L1) having a smaller angle with respect to the vertical direction, a part of the external light (e.g., the light L2) having a larger angle with respect to the vertical direction irradiates the sensing element 142. In FIG. 16, the part of the external light (e.g., the light L2) having a larger angle with respect to the vertical direction may irradiate the sensing element 142 overlapping the sub-pixel SP2, but not limited thereto.

Optionally, the display device 600 may further include an encapsulation layer 610 disposed on the light emitting component 124 (i.e., the light emitting component 124 is between the encapsulation layer 610 and the substrate 110), so as to protect the structure(s) and/or the component(s) covered by the encapsulation layer 610. The encapsulation layer 610 may include any suitable encapsulating material, such as organic insulating material, but not limited thereto. Note that the encapsulation layer 610 may be used in any aforementioned embodiment.

In FIG. 16, the first edge ED1 of the first through hole TH1 of the light shielding layer 130 may be covered by the insulating layer (e.g., the insulating layer IL1), and the edges of the through holes of the insulating layers (e.g., the insulating layer IL1, the insulating layer IL2, the insulating layer IL3 and the insulating layer IL4) may be covered by the encapsulation layer 610. In some embodiments, a refractive index of the encapsulation layer 610 may be greater than refractive indexes of the insulating layer IL1, the insulating layer IL2, the insulating layer IL3 and the insulating layer IL4 (e.g., these insulating layers include inorganic insulating material). Therefore, when the part of the external light (e.g., the light L2) having a larger angle with respect to the vertical direction enters the recess region RS, this external light is refracted towards the sensing element 142 due to the relation between the refractive indexes of the encapsulation layer 610 and the insulating layers (e.g., the insulating layer IL1, the insulating layer IL2, the insulating layer IL3 and the insulating layer IL4), so as to increase the light intensity of the external light received by the sensing element 142. In FIG. 16, since the dimension of the first through hole TH1 may be greater than the dimension of the second through hole TH2, and the refractive index of the encapsulation layer 610 may be greater than the refractive indexes of the insulating layer IL1, the insulating layer IL2, the insulating layer IL3 and the insulating layer IL4 (e.g., these insulating layers include inorganic insulating material), the light intensity of the external light received by the sensing element 142 is enhanced. In some embodiments, the sensing element 142 may even sense the external image information overlapping the sub-pixel SP2.

In summary, by the design of the through holes of the layers or the existence of the light shielding layer, the sensing accuracy, the sensing clearness and/or the light intensity of the received light of the sensing element will be enhanced, and the display device will be operated normally.

Although the embodiments and their advantages of the present disclosure have been described as above, it should be understood that any person having ordinary skill in the art can make changes, substitutions, and modifications without departing from the spirit and scope of the present disclosure. In addition, the protecting scope of the present disclosure is not limited to the processes, machines, manufactures, material compositions, devices, methods and steps in the specific embodiments described in the description. Any person having ordinary skill in the art can understand the current or future developed processes, machines, manufactures, material compositions, devices, methods and steps from the content of the present disclosure, and then, they can be used according to the present disclosure as long as the same functions can be implemented or the same results can be achieved in the embodiments described herein. Thus, the protecting scope of the present disclosure includes the above processes, machines, manufactures, material compositions, devices, methods and steps. Moreover, each claim constitutes an individual embodiment, and the protecting scope of the present disclosure also includes the combination of each claim and each embodiment. The protecting scope of the present disclosure shall be determined by the appended claims.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display panel having a display region which has a sensing area, comprising:
   a substrate;
   a semiconductor layer disposed on the substrate;
   a light shielding layer disposed between the semiconductor layer and the substrate, having at least one first through hole in the sensing area; and
   a first insulating layer disposed on the semiconductor layer and having at least one second through hole in the sensing area, wherein the semiconductor layer is disposed between the light shielding layer and the first insulating layer;
   wherein the at least one first through hole and the at least one second through hole are overlapped with each other;
   wherein in a cross section view of the display panel, one of the at least one first through hole has a first edge, one of the at least one second through hole has a second edge which is close to the first edge and a distance between the first edge and the second edge is greater than zero;
   wherein a number of the at least one first through hole is different from a number of the at least one second through hole.

2. The display panel of claim 1, wherein the distance between the first edge and the second edge is less than 5 μm.

3. The display panel of claim 2, wherein the distance between the first edge and the second edge is less than 3 μm.

4. The display panel of claim 1, wherein a first maximum width of one of the at least one first through hole is less than a second maximum width of one of the at least one second through hole.

5. The display panel of claim 1, wherein a first maximum width of one of the at least one first through hole is greater than a second maximum width of one of the at least one second through hole.

6. The display panel of claim 1, wherein the at least one first through hole has a curved edge in a top view of the display panel.

7. The display panel of claim 1, wherein the at least one second through hole has a curved edge in a top view of the display panel.

8. The display panel of claim 1, wherein an angle between the first edge and a surface of the substrate is different from an angle between the second edge and the surface of the substrate.

9. The display panel of claim 1, further comprising a second insulating layer disposed on the first insulating layer, wherein the second insulating layer has a third through hole in the sensing area and the third through hole and the at least one second through hole are overlapped with each other.

10. The display panel of claim 9, wherein the first insulating layer is different from the second insulating layer in material.

11. The display panel of claim 9, further comprising a conductive layer disposed on the second insulating layer, wherein the conductive layer has a fourth through hole in the sensing area and the fourth through hole and the third through hole are overlapped with each other.

12. The display panel of claim 1, wherein the substrate has a pattern structure in the sensing area.

13. The display panel of claim 1, wherein the at least one first through hole of the light shielding layer comprises a plurality of first through holes, the at least one second through hole of the first insulating layer comprises a plurality of second through holes, and the plurality of first through holes are overlapped with the plurality of second through holes respectively.

14. The display panel of claim 13, wherein an area of one of the first through holes is different from an area of another one of the first through holes.

15. The display panel of claim 1, wherein the at least one first through hole of the light shielding layer comprises a plurality of first through holes.

16. The display panel of claim 1, wherein the at least one second through hole of the first insulating layer comprises a plurality of second through holes.

17. A display device, comprising:
a sensing element; and
a display panel having a display region which has a sensing area overlapped with the sensor element, comprising:
a substrate;
a semiconductor layer disposed on the substrate;
a light shielding layer disposed between the semiconductor layer and the substrate, having at least one first through hole in the sensing area; and
an insulating layer disposed on the semiconductor layer and having at least one second through hole in the sensing area, wherein the semiconductor layer is disposed between the light shielding layer and the insulating layer;
wherein the at least one first through hole and the at least one second through hole are overlapped with each other;
wherein in a cross section view of the display panel, one of the at least one first through hole has a first edge, one of the at least one second through hole has a second edge which is close to the first edge and a distance between the first edge and the second edge is greater than zero;
wherein a number of the at least one first through hole is different from a number of the at least one second through hole.

* * * * *